US012737413B1

(12) United States Patent
Rethage et al.

(10) Patent No.: US 12,737,413 B1
(45) Date of Patent: Sep. 15, 2026

(54) SYSTEMS AND METHODS FOR QUERYING THREE-DIMENSIONAL (3D) MODELS USING DESCRIPTORS

(71) Applicant: HOVER INC., San Francisco, CA (US)

(72) Inventors: Dario Rethage, Kendall Park, NJ (US); Brandon Scott, New York, NY (US)

(73) Assignee: HOVER INC., San Francisco, CA (US)

( * ) Notice: Subject to any disclaimer, the term of this patent is extended or adjusted under 35 U.S.C. 154(b) by 0 days.

(21) Appl. No.: 17/371,548

(22) Filed: Jul. 9, 2021

Related U.S. Application Data

(60) Provisional application No. 63/218,074, filed on Jul. 2, 2021, provisional application No. 63/050,002, filed on Jul. 9, 2020.

(51) Int. Cl.

| | |
|---|---|
| ***G06F 16/583*** | (2019.01) |
| ***G06F 16/532*** | (2019.01) |
| ***G06F 30/10*** | (2020.01) |
| ***G06N 3/08*** | (2023.01) |
| ***G06N 20/20*** | (2019.01) |
| ***G06T 7/50*** | (2017.01) |

(52) U.S. Cl.
CPC .......... *G06F 16/583* (2019.01); *G06F 16/532* (2019.01); *G06F 30/10* (2020.01); *G06N 3/08* (2013.01); *G06N 20/20* (2019.01); *G06T 7/50* (2017.01)

(58) Field of Classification Search
None
See application file for complete search history.

(56) References Cited

U.S. PATENT DOCUMENTS

| | | | |
|---|---|---|---|
| 11,282,180 B1 | 3/2022 | Saxena et al. | |
| 11,445,232 B2 | 9/2022 | Browy et al. | |
| 2010/0201682 A1 | 8/2010 | Quan et al. | |
| 2015/0269438 A1* | 9/2015 | Samarasekera | G06F 18/24 382/154 |
| 2017/0154204 A1* | 6/2017 | Ryu | G06V 10/462 |
| 2018/0137642 A1 | 5/2018 | Malisiewicz et al. | |
| 2018/0137647 A1 | 5/2018 | Li et al. | |

(Continued)

FOREIGN PATENT DOCUMENTS

| | | |
|---|---|---|
| CN | 108205655 A | 6/2018 |
| EP | 3493104 A1 | 6/2019 |

(Continued)

OTHER PUBLICATIONS

U.S. Appl. No. 17/371,542, "Notice of Allowance", Jul. 25, 2022, 11 pages.

(Continued)

*Primary Examiner* — Giuseppi Giuliani
(74) *Attorney, Agent, or Firm* — Kilpatrick Townsend & Stockton LLP

(57) ABSTRACT

The present disclosure generally relates to systems and methods for descriptor-based querying of 3D models of physical structures. A plurality of descriptors can be generated to numerically represent the structural features of existing 3D models stored in a database. A new descriptor may be generated to represent structural features of a new 3D model. Existing 3D models that are structurally similar to the new 3D model can be identified by comparing the new descriptor with the descriptors of the existing 3D models.

21 Claims, 12 Drawing Sheets

(56) References Cited

U.S. PATENT DOCUMENTS

| | | | | |
|---|---|---|---|---|
| 2018/0255290 | A1 | 9/2018 | Holzer et al. | |
| 2018/0268220 | A1 | 9/2018 | Lee et al. | |
| 2019/0147221 | A1 | 5/2019 | Grabner et al. | |
| 2019/0172223 | A1 | 6/2019 | Vajda et al. | |
| 2019/0172224 | A1 | 6/2019 | Vajda et al. | |
| 2020/0151572 | A1* | 5/2020 | Gurumurthi | G06N 3/084 |
| 2020/0273177 | A1* | 8/2020 | Chen | G06V 20/653 |
| 2020/0320747 | A1* | 10/2020 | Izumi | G06T 5/50 |
| 2020/0394413 | A1 | 12/2020 | Bhanu et al. | |
| 2020/0401617 | A1* | 12/2020 | Spiegel | G06F 16/587 |
| 2021/0027083 | A1 | 1/2021 | Cohen et al. | |
| 2021/0150252 | A1 | 5/2021 | Sarlin et al. | |
| 2021/0150679 | A1* | 5/2021 | Roulet | G06N 3/086 |
| 2021/0183097 | A1 | 6/2021 | Georgakis et al. | |
| 2021/0241015 | A1 | 8/2021 | Song et al. | |
| 2021/0315485 | A1 | 10/2021 | Matusik et al. | |
| 2021/0357630 | A1 | 11/2021 | Shaevitz et al. | |
| 2022/0262023 | A1* | 8/2022 | Vignard | G06V 10/82 |
| 2022/0292717 | A1* | 9/2022 | Tan | G06V 20/64 |
| 2023/0217001 | A1 | 7/2023 | Holzer et al. | |
| 2026/0087658 | A1 | 3/2026 | Huang | |
| 2026/0120402 | A1 | 4/2026 | Chalasani et al. | |

FOREIGN PATENT DOCUMENTS

| | | | |
|---|---|---|---|
| WO | 2019232894 | A1 | 12/2019 |
| WO | 2021152547 | A1 | 8/2021 |

OTHER PUBLICATIONS

Kong, et al., "Hypernet: Towards Accurate Region Proposal Generation and Joint Object Detection", Proceedings of the IEEE Conference on Computer Vision and Pattern Recognition, Apr. 3, 2016, pp. 845-853.

Ku, et al., "Joint 3D Proposal Generation and Object Detection from View Aggregation", IEEE/RSJ International Conference on Intelligent Robots and Systems, Jul. 12, 2018, 8 pages.

Li, et al., "Factorizable Net: An Efficient Subgraph-based Framework for Scene Graph Generation", In Proceedings of the European Conference on Computer Vision (ECCV), Oct. 6, 2018, pp. 1-17.

U.S. Appl. No. 17/971,974, "Notice of Allowance", Aug. 28, 2023, 10 pages.

U.S. Appl. No. 18/519,960, "Notice of Allowance", Sep. 26, 2024, 10 pages.

Reddy, et al., "Occlusion-Net: 2D/3D Occluded Keypoint Localization Using Graph Networks", Institute of Electrical and Electronics Engineers / CVF Conference on Computer Vision and Pattern Recognition (CVPR), Jun. 15-20, 2019, pp. 7326-7335.

U.S. Appl. No. 18/991,238, "Notice of Allowance", Jun. 15, 2026, 12 pages.

Chen, et al., "Learning to Predict 3D Objects with an Interpolation-based Differentiable Renderer", Available Online on: https://arxiv.org/abs/1908.01210, Nov. 21, 2019, 11 pages.

Suwajanakorn, et al., "Discovery of Latent 3D Keypoints via End-to-end Geometric Reasoning", Available Online on: https://arxiv.org/abs/1807.03146, Nov. 23, 2018, 14 pages.

* cited by examiner

100

900

1100

SYSTEMS AND METHODS FOR QUERYING THREE-DIMENSIONAL (3D) MODELS USING DESCRIPTORS

CROSS-REFERENCE TO RELATED APPLICATIONS

This application claims the benefit of and priority to U.S. Provisional Application Nos. 63/050,002, filed Jul. 9, 2020, and 63/218,074, filed Jul. 2, 2021, all of which are hereby incorporated by reference in their entireties.

TECHNICAL FIELD

The present disclosure generally relates to descriptor-based querying of 3D models of physical structures. More specifically, but not by way of limitation, the present disclosure relates to generating a new descriptor that numerically represents structural features of a new 3D model and identifying existing 3D models that are similar to the new 3D model using the new descriptor. The similarity between the new 3D model and an existing 3D model may be determined based on a similarity between the new descriptor and an existing descriptor of the existing 3D model.

BACKGROUND

A physical structure can be represented as a digital 3D model using executable code (e.g., a specialized software tool). A 3D model of a physical structure can include data that represents a complex combination of structural features. When a set of 3D models is stored in a database, querying the database for subsequent retrieval can be computationally burdensome, given the complexity of the 3D models. Further, a structural feature (e.g., a gable) between two different 3D models can be similar, but not exactly the same. In these situations, characterizing a comparison of two different 3D models is a technical challenge.

BRIEF SUMMARY

A database may store a plurality of 3D models of physical structures. For example, a 3D model of a physical structure may be a 3D computer-aided design (CAD) representation of a house. Certain aspects of the present disclosure relate to generating a descriptor to represent a 3D model of a physical structure, such as a new 3D model (e.g., one that may not be stored in the database). In some examples, structural features (e.g., the location of a roof, ridge, rake, eave line, or apex) represented by the new 3D model may be evaluated to generate the descriptor. In some examples, images generated using the 3D model may be evaluated to generate the descriptor. In some implementations, a descriptor may be generated using an image of a top-down view of a roof of a physical structure. In other implementations, a descriptor may be generated using a synthetic (e.g., virtual) image of a top-down view of a roof of a physical structure. In yet other implementations, a descriptor may be generated based on a 3D model of a physical structure that is reconstructed from a two-dimensional (2D) image. In some examples, a descriptor may be generated using one or more depth images of a physical structure. The depth images may be generated using a 3D model of a physical structure and may be evaluated to generate the descriptor, such as 2D projections of the 3D model from one or more viewpoints, such as a top view, a side view, a front view, a rear view, etc., where pixel information in the image may represent distances of surfaces of the physical structure from the corresponding viewpoint. The depth images may be generated directly from other techniques, such as generation of a depth image by LIDAR or other range scanning method, using stereo image pairs, or other known techniques for measuring objects in three dimensions. In some implementations, a descriptor may be generated using machine-learning models, such as an auto-encoder neural network.

Certain aspects of the present disclosure also include retrieving existing 3D models or descriptors for 3D models that are similar to a particular 3D model (e.g., a new 3D model) by querying the database using the descriptor. Querying the database may include, for example, computing a Hamming distance between a new descriptor representing the new 3D model and an existing descriptor of an existing 3D model stored in the database. The Hamming distance is the sum of the differing bits between two descriptors. Optionally, querying the database may use the descriptor for a particular 3D model (e.g., a new 3D model) as input to identify one or more output descriptors corresponding to other 3D models that are similar to the particular 3D model. Querying the database may comprise using the descriptor as input for performing a search or other filtering algorithm on the data structure to identify the output, such as a decision tree-based search or filter, a random forest search or filter, or the like.

In some implementations, a descriptor may be generated to represent a target physical structure (e.g., a building for which similar buildings are queried), a 3D model of a target physical structure, images of the 3D model or physical structure (e.g., depth images), or the like. The descriptor may comprise a vector, such as a multi-element vector. For example, the vector may distill structural features of the target physical structure. In some implementations, the vector may be constrained to include binary values or bits (e.g., "1" or "0"), such as where each bit of a descriptor may correspond to the presence or absence of a primitive feature (e.g., presence of roofing) within an image frame or the presence of features in neighboring pixels or regions of the image frame. In some implementations, values in the vector may be constrained to a particular number of bits, such as a 1-bit number, a 4-bit number, an 8-bit number, a 16-bit number, a 32-bit number, a 64-bit number, or the like. Elements of the vector may not necessarily correspond to the presence or absence of a primitive feature, but may instead correspond to an encoded representation of a 3D model, or one or more images (e.g., depth images) generated using the 3D model. Example descriptors may be generated, by encoding the 3D model or an image or projection made using the 3D model, such as at a plurality of different spatial scales, using a machine-learning model, as described in more detail below.

A descriptor, such as a descriptor representing the target physical structure or images of the target physical structure or a 3D model of the target physical structure (e.g., depth images), can be compared with another descriptor (e.g., representing another physical structure or images of another physical structure or 3D model of another physical structure). For example, a Hamming distance between two descriptors can be determined. The Hamming distance may represent a degree of structural similarity between the target physical structure and the other physical structure. The present disclosure is not limited to using a Hamming distance to determine similarity between two descriptors. Other techniques, as described herein, may also be used, such as cosine similarity. For example, similarities between descriptors can be determined to compare two or more descriptors.

In one example, a vector similarity or vector similarity magnitude between a first multi-element vector representation corresponding to a first descriptor and a second multi-element vector representation corresponding to a second descriptor can be determined. In some cases, weighting factors can be applied to different vector elements in a descriptor or in a vector similarity to adjust or account for the relative importance of different aspects or features. In some examples, descriptors generated using the same type of source may be used when evaluating similarity. For example, descriptors generated using one or more depth images generated from a 3D models of physical structures may be used for evaluating similarity. As another example, descriptors generated using single depth images may be used for evaluating similarity As privacy protections increase for digital services and personal data like geolocation or address information becomes more restricted, non-geographic query techniques are becoming more valuable. In some examples, a geo-query search module may therefore search using location-agnostic metadata, such as a descriptor or other binary string representing the image's structural features and determine similarity based on descriptor analysis, such as Hamming distance minimization, cosine similarity, etc.

Implementations of the described techniques may include a system or hardware, a method or process, or computer software on a computer-accessible or computer-readable medium. In some implementations, a system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. In some examples, the actions comprise computer-implemented methods described herein.

In various aspects, computer-implemented methods are described herein. An example method of this aspect may include: storing a plurality of existing 3D models in a data structure, each existing 3D model of the plurality of existing 3D models capable of having a descriptor extracted that characterizes its physical structure. The computer-implemented method also includes receiving a new 3D model. The computer-implemented method also includes generating a new descriptor representing the new 3D model. The computer-implemented method also includes determining a similarity between the new descriptor and the descriptor associated with each existing 3D model of the plurality of existing 3D models. The computer-implemented method also includes identifying at least one existing 3D model from amongst the plurality of existing 3D models, the at least one existing 3D model being identified based on the determined similarity between the new descriptor and the descriptor associated with the identified existing 3D model. The computer-implemented method also includes retrieving the identified at least one existing 3D model. Other embodiments of this aspect include corresponding computer systems, apparatus, and computer programs recorded on one or more computer storage devices, each configured to perform the actions of the methods.

Implementations may include one or more of the following features. The computer-implemented method where generating the new descriptor may further include inputting data associated with the new 3D model into a machine-learning model. The computer-implemented method may also include generating, as an output of the machine-learning model, an encoded representation of the new 3D model. The encoded representation may be the new descriptor. The computer-implemented method where generating the new descriptor further includes receiving an image of a top-down view of a physical structure. The computer-implemented method may also include extracting one or more structural features from the image. The computer-implemented method may also include generating the new descriptor using the one or more structural features. The computer-implemented method may use a virtual image of the 3D model as the image. The computer-implemented method may also determine the similarity between the new descriptor and the descriptor associated with each existing 3D model by: determining, for each existing 3D model of the plurality of existing 3D models, a hamming distance between the new descriptor and the descriptor associated with existing 3D models. The computer-implemented method may also include determining, for each existing 3D model of the plurality of existing 3D models, a similarity between the new 3D model and the existing 3D model based on the hamming distance. The computer-implemented method where storing the plurality of existing 3D models in the data structure further includes: generating a tree-based data structure configured to organize the plurality of existing 3D models into one or more groups, where each group of the one or more groups is associated with a structural feature of the physical structure. The computer-implemented method may also include storing the plurality of existing 3D models in the tree-based data structure according to the one or more groups. The computer-implemented method further including: querying the tree-based data structure to identify the existing 3D model, where the querying includes disqualifying a group of the one or more groups of existing 3D models, and the disqualifying being based on the determined difference between the new descriptor and the descriptor of at least one existing 3D model included the group.

Another example computer implemented method comprises obtaining or generating one or more depth images of a physical structure, and generating a descriptor characterizing the physical structure using the one or more depth images. In examples, the one or more depth images may comprise a single depth image of the physical structure, such as generated from a 3D model of the physical structure, generated from one or more direct measurements of the physical structure (e.g., LIDAR measurement or stereo image pairs). In some cases, a plurality of depth images may be used. For example, in some cases, a computer implemented method comprises obtaining a three-dimensional (3D) model of a physical structure; generating one or more depth images using the 3D model, and generating a descriptor characterizing the 3D model using the one or more depth images. Depth images may optionally be generated to fill an image frame without cropping, so that spatial scaling (as explained below) can process as many pixels as possible. Example machine-learning models useful with the methods described herein include, but are not limited to, machine-learning models that use a plurality of convolutional layers or a plurality of pooling layers, or autoencoder neural network-based machine learning models.

Without limitation, a 3D model of the physical structure can be generated locally or obtained from a remote location. In some examples, a depth image corresponds to a two-dimensional (2D) projection of the physical structure from a corresponding viewpoint, optionally including pixel information representing distances of surfaces of the physical structure from the corresponding viewpoint. In examples, depth images are primary orthogonal projections of the physical structure, such as a top view of the physical structure, a front view of the physical structure, a rear view of the physical structure, a left view of the physical structure, or a right view of the physical structure. Aspects of these methods may be repeated one or more times, such as for a plurality of additional 3D models or physical structures, which may be useful for creating a library of descriptors, for example. For example, obtaining an additional 3D model, generating one or more depth images using the additional 3D model, and generating, using the machine-learning model, an additional descriptor characterizing the additional 3D model using the one or more depth images, may be repeated one or more times, such as for each of the one or more depth images. As another example, generating or obtaining one or more depth images of a physical structure, and generating, using the machine-learning model, an additional descriptor, may be repeated one or more times, such as for each of the one or more depth images. Once generated, the additional descriptor(s) for the additional 3D model(s) or physical structure(s) may be stored to a data store or in a data structure.

As described above, the descriptor may comprise or correspond to a multi-element vector encoded representation of one or more of depth images. In some examples, elements of the multi-element vector refer to encoded representations of an input image that is serially fed forward into the encoding process different spatial scales. In some examples, the descriptor may be generated by encoding the one or more depth images at a plurality of different spatial scales using a feedforward convolution network. A spatial scale can refer to a pixel resolution of a depth image or encoded representation of the depth image. Example spatial scales can range from a full resolution of the original depth image (e.g., a full size of the depicted 3D model or physical structure in the depth image) through sequentially lower resolution encoded representations of the depth image.

In example implementations, the encoding process for reducing spatial resolution can comprise convolving a kernel of learned parameters across the pixel elements of the input with a stride greater than 1 to generate an encoded output with a reduced number of pixel elements, which may be referred to as an encoded depth image. This encoded depth image may be fed forward into the encoding process again to further reduce the spatial resolution, such as by again convolving a kernel of learned parameters across the pixel elements of the input with a stride greater than 1 to generate an encoded output with a reduced number of pixel elements. This process may be repeated one or more times, such as for a threshold or predetermined number of encodings or until a number of pixels in the output encoded depth image reaches or falls below a threshold value (e.g., a threshold horizontal number of pixels, a threshold vertical number of pixels, a threshold total number of pixels). At each spatial scale, an encoded representation of the input may be assigned as a vector element in the descriptor for the one or more depth images. The encoded representation can be generated using the encoding process just described above or another encoding process can be used. For example, the encoding process used to generate the vector element of a descriptor can comprise convolving a kernel of learned parameters across the pixel elements of the input with a stride equal to 1, thus capturing details of the input at its full resolution.

Smaller kernel sizes (e.g., 2×2) used for a convolution can give more specific or less abstract outputs that may be very closely correlated with the input. Smaller kernels sizes, then, can be useful for spatial scaling to retain stronger correlation between the input and the output. In some examples, the encoding used for spatial scaling may employ a small kernel, such as a 2×2 kernel or a 3×3 kernel, at a stride greater than 1 (e.g., 2). When searching for results similar to one another based on encoded images using small kernel sizes (e.g. 2×2), only images that are very close to one another will be strongly similar, which may result in a small number of search returns. Larger kernels can summarize or abstract the underlying data faster, but give an output that is less strongly correlated with the input, which may allow for easier comparison between different images. When searching for results similar to one another based on encoded images using very large kernels (e.g., 7×7), images that are very different can be highly correlated, but this may result in a large number of search returns that have poor similarity. In some examples, the encoding used for generating vector elements for a descriptor may employ a 3×3 kernel or a 4×4 kernel at a stride equal to 1. Search query return quantities may similarly be affected by the number of spatial scales with the size of the kernel in any one scale, and employ variable kernel sizes across spatial scales. For example, larger kernels in earlier spatial scales may generate a descriptor or portion of a descriptor encoding or indicative of general structural features or image constituent aspect, while subsequent spatial scaling may use smaller kernels for more precise feature encodings. Fewer spatial scales result in simpler system architectures and more efficient querying.

Each successive spatial scale, due to the serial processing, comprises information of a higher spatial scale. At high resolution spatial scales, structural details, such as a window, pillar, gable, door, roof line, or other sub-component of the structure, can be captured. As the spatial scale resolution lowers, those elements are more difficult to discern in the instant image but more global information is preserved. Sequential spatial scaling then serves as increasingly abstract (at each successive spatial scale) feature mapping. For example at a first spatial scale a discrete gable may be detected or encompassed in the encoded representation, but at a lower spatial scale the pixel size may be large enough that a gable is not identifiable but an encoder still embeds the larger pixels at that spatial scale with attributes of the higher resolution spatial scale. In this way, at the lower resolution spatial scales the encoder may generate data indicative of relative positioning of structural elements (e.g. a gable between two windows, even though the pixel data at that spatial scale has no human discernible gables or windows). Optionally, 2 or more, 3 or more, 4 or more, 5 or more, 6 or more, or 7 or more spatial scales may be used. The descriptor may comprise an encoded representation of the one or more depth images after encoding at the plurality of different spatial scales.

With a library of descriptors available, such as stored in a data structure or other data storage element or extracted from stored data elements, descriptors can be compared to identify or determine similarities between evaluated structures. For example, it may be desirable to search the library for the top one or several descriptors representing a 3D model or physical structure close to or similar to a test or new 3D model or physical structure, such as by computing a similarity, which can be a quantifiable factor representing how close two descriptors are to one another. In some implementations, an example computer-implemented method further comprises accessing a plurality of descriptors from existing 3D models; querying the accessed descriptors to identify one or more output descriptors using the descriptor as input, such as where the one or more output descriptors comprise descriptors from the plurality of existing 3D models exhibiting a similarity to the descriptor greater than a threshold value. In some examples, a similarity characterizes a vector similarity or vector similarity magnitude between a first multi-element vector corresponding to a first descriptor and a second multi-element vector corresponding to a second descriptor.

Depending on how the descriptors are stored or accessed, the query process of comparing descriptors can be performed using a variety of different techniques. In some examples, querying the data structure of the plurality of existing descriptors comprises performing a tree-traversal-based search algorithm through the data structure to identify the one or more output descriptors. Optionally, querying the data structure of the plurality of existing descriptors comprises using one or more decision trees to identify the one or more output descriptors. In some examples, querying the data structure of the plurality of existing descriptors comprises comparing each of the existing descriptors with the descriptor to compute a similarity and identifying existing descriptors for which the similarity is above a threshold as output descriptors. In some cases, it may be desirable to use the output descriptors to identify additional descriptors for similar 3D models or physical structures. In such cases, the output descriptors can be used in a method further comprising analyzing the plurality of existing descriptors to identify one or more additional similar output descriptors using the one or more output descriptors as input.

With similar descriptors available after the above-described process, it may be desirable to visualize the corresponding 3D models. In some examples, a method of this aspect may further comprise obtaining one or more corresponding existing 3D models associated with the one or more output descriptors. Optionally, the descriptor may comprise a 3D model identifier or be stored in association with a corresponding 3D model to allow for retrieval of the 3D model using the descriptor. Optionally, a method of this aspect may further comprise generating a display of the one or more corresponding existing 3D models and the 3D model.

In embodiments, since the descriptors can correspond to encoded representations of one or more depth images, it may be desirable to decode the descriptors to obtain decoded depth images and compare with the original depth images. Such a process can give insights as to how well the machine-learning model is performing. In some cases, the original and output depth images can be further used to train the machine-learning model. In some examples, methods of this aspect may further comprise updating the machine-learning model by generating or obtaining one or more depth images for the one or more corresponding existing 3D models or physical structures; decoding the descriptor and the one or more output descriptors to generate one or more decoded depth images; comparing the one or more decoded depth images to corresponding unencoded depth images to determine a training factor; and adjusting the machine-learning model based on the training factor. Optionally, methods of this aspect may further comprise training the machine-learning model by repeating one or more times: decoding the descriptor to generate one or more decoded depth images; comparing the one or more decoded depth images to the one or more depth images to determine a training factor; adjusting the machine-learning model based on the training factor; and using the machine-learning model to update the descriptor using the one or more depth images. Optionally, the training may be stopped when the training factor meets a threshold training factor. Optionally, a method of this aspect may further comprise performing additional training of the machine-learning model by: obtaining an additional 3D model of an additional physical structure; generating one or more depth images using the additional 3D model; using the machine-learning model to generate an additional descriptor characterizing the additional 3D model using the one or more additional depth images; and training the machine-learning model by repeating one or more times: decoding the additional descriptor to generate one or more additional decoded depth images; comparing the one or more additional decoded depth images to the one or more additional depth images to update the training factor; adjusting the machine-learning model based on the training factor; and using the machine-learning model to update the additional descriptor using the one or more additional depth images. Optionally, a method of this aspect may further comprise performing additional training of the machine-learning model by: generating or obtaining one or more additional depth images of an additional physical structure; using the machine-learning model to generate an additional descriptor characterizing the additional physical structure using the one or more additional depth images; and training the machine-learning model by repeating one or more times: decoding the additional descriptor to generate one or more additional decoded depth images; comparing the additional one or more decoded depth images to the one or more additional depth images to update the training factor; adjusting the machine-learning model based on the training factor; and using the machine-learning model to update the additional descriptor using the one or more additional depth images. Such processes may be further repeated for a plurality of additional 3D models or physical structures. The training factor may comprise a set of adjustable parameters for the machine learning model or changes to a set of adjustable parameters for the machine learning model, for example.

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to appropriate portions of the entire specification of this disclosure, any or all drawings and each claim.

BRIEF DESCRIPTION OF THE DRAWINGS

The specification makes reference to the following appended figures, in which use of like reference numerals in different figures is intended to illustrate like or analogous components.

In the appended figures, similar components and/or features may have the same reference label. Where the reference label is used in the specification, the description is applicable to any one of the similar components having the same reference label.

DETAILED DESCRIPTION

Certain aspects and features of the present disclosure relate to enhanced retrieval of 3D models from a database using descriptors. Retrieving existing 3D models that are structurally similar to a new 3D model (e.g., one which is not stored in the database) is a significant technical challenge. Structural features between different 3D models can be of the same type (e.g., a gable), but can have differing dimensions, which complicates the retrieval of similar 3D models from the database.

Certain aspects of features of the present disclosure relate to generating a descriptor that numerically represents structural features of a new 3D model or a new physical structure or that numerically represents views of a new 3D model or a new physical structure. Several non-limiting implementations can be used to generate the descriptor, as described herein. Once generated, the descriptor can be used to determine the similarity between the new 3D model or physical structure and existing 3D models stored or represented in the database, such as by comparing descriptors for the new 3D model or physical structure and existing 3D models or physical structures without having to compare elements or aspects of the 3D models and/or physical structures directly. Additionally, a specialized data structure can be used to store the existing 3D models or other representation of a physical structure (and their corresponding descriptors) to enhance the speed of querying. As a non-limiting example, the specialized data structure may be configured as a tree-based data structure that enables fast approximate nearest neighbor search (FANN) in sub-linear time (e.g., logarithmic time complexity). The organization of the branches or nodes in the tree-based data structure may be determined by the descriptors stored in the database. For example, the branches or nodes in the tree-based data structure may be determined based on the presence or non-presence of descriptor elements. In other implementations, a random forest filtering or search algorithm can be used to compare descriptors to identify similar 3D models and/or physical structures.

These illustrative examples are given to introduce the reader to the general subject matter discussed here and are not intended to limit the scope of the disclosed concepts. The following sections describe various additional features and examples with reference to the drawings in which like numerals indicate like elements, and directional descriptions are used to describe the illustrative embodiments but, like the illustrative embodiments, should not be used to limit the present disclosure. The elements included in the illustrations herein may not be drawn to scale.

Figure 1:
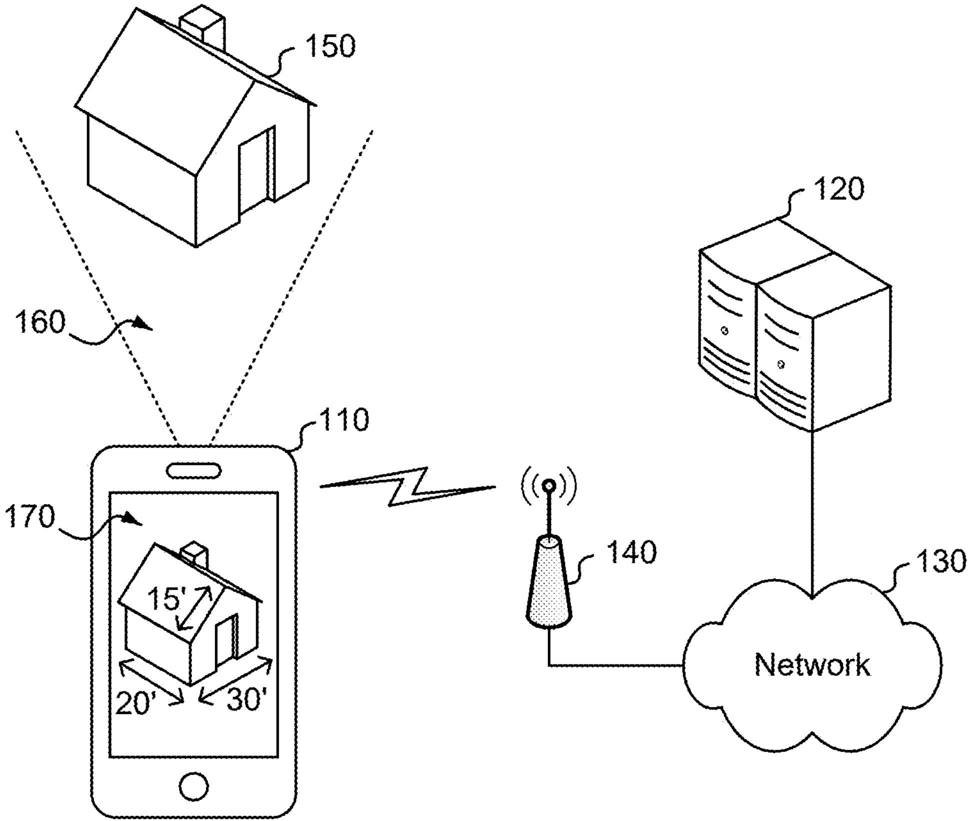
FIG. 1 is block diagram illustrating an example of a network environment, according to certain aspects of the present disclosure.

FIG. 1 is block diagram illustrating an example of a network environment 100, according to certain aspects of the present disclosure. Network environment 100 may include user device 110 and server 120. User device 110 may be any portable (e.g., mobile devices, such as smartphones, tablets, laptops, application specific integrated circuits (ASICs), and the like) or non-portable computing device (e.g., desktop computer, electronic kiosk, and the like). User device 110 may be connected to gateway 140 (e.g., a Wi-Fi access point), which provides access to network 130. Network 130 may be any public network (e.g., Internet), private network (e.g., Intranet), or cloud network (e.g., a private or public virtual cloud). User device 110 may communicate with server 120 through network 130.

A native or web application may be executing on user device 110. The native or web application may be configured to perform various functions relating to analyzing an image of a physical structure, such as a house. As an illustrative example, the native or web application may be configured to perform a function that captures a 2D image of house 150 within the camera's field of view 160. The function may also transmit the 2D image to server 120 for analysis. Server 120 may analyze the 2D image to automatically detect or compute the dimensions of house 150 by evaluating the pixels of 2D image. For example, server 120 may execute one or more computer vision techniques, such as keypoint detection, edge detection, or semantic segmentation, to determine the dimensions of house 150. Server 120 may transmit the detected or computed dimensions of house 150 to the native or web application executing on user device 110. In response to receiving the detected or computed dimensions of house 150, the native or web application may display a final image 170, which presents an overlay of the dimensions on top of the 2D image of house 150. The present disclosure is not limited to performing the function on server 120. The function can be entirely performed on user device 110 without the need for server 120. Additionally, the present disclosure is not limited to the use of a native or web application executing on user device 110. Any executable code (whether or not the code is a native or web application) can be configured to perform at least a part of the function for algorithmically determining the dimensions of house 150.

Figure 2:
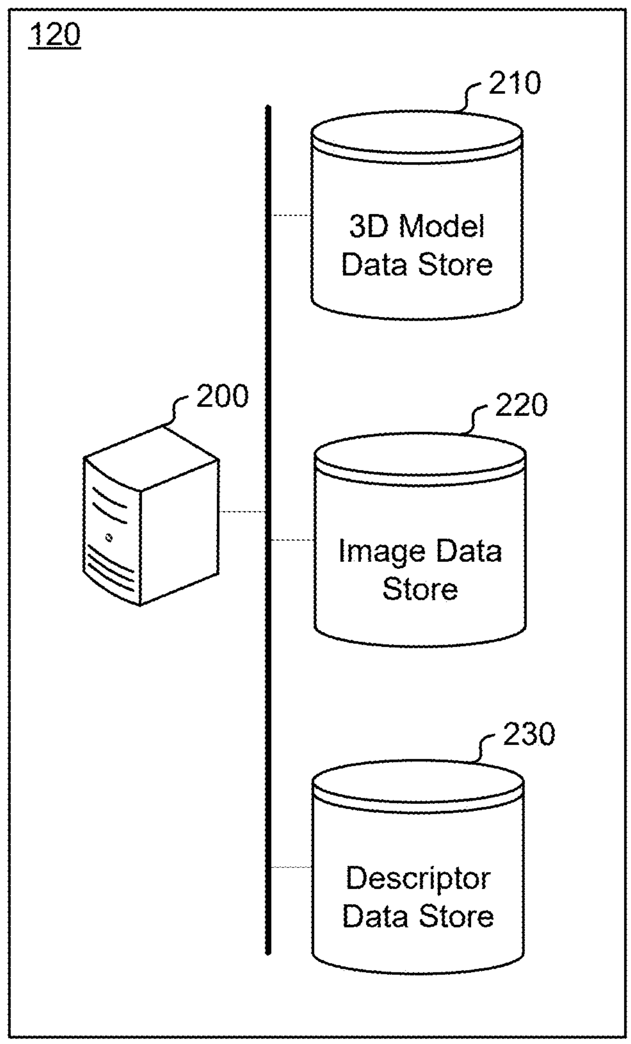
FIG. 2 is a block diagram illustrating components of a server, according to certain aspects of the present disclosure.

FIG. 2 is a block diagram illustrating components of server 120, according to certain aspects of the present disclosure. In some implementations, server 120 may include several components, including a processor 200, 3D model data store 210, image data store 220, and descriptor data store 230. Processor 200 may be a processor or processing apparatus (e.g., a server) configured to execute executable code that performs the various functions of server 120. The executable code may be stored in a memory (not shown) associated with the processor 200. Processor 200 may query 3D model data store 210 to identify 3D models that are similar to a new 3D model, according to certain embodiments described herein. For example, processor 200 may calculate a Hamming distance between the descriptor of the new 3D model and each descriptor stored in descriptor data store 230. In some implementations, processor 200 may generate the descriptors stored in descriptor data store 230 by, for example, executing executable code that causes a 2D image of a top-down view of a physical structure to be analyzed for keypoints. Processor 200 may process the images to generate descriptors, for example, by detecting a set of keypoints within an image, such as 14 keypoints.

3D model data store 210 may be configured to include a data structure that stores one or more existing 3D models of physical structures. Non-limiting examples of a 3D model of a physical structure include a CAD model, a pseudo-voxelized volumetric representation, mesh geometric representation, a graphical representation, a 3D point cloud, or any other suitable 3D model of a virtual or physical structure. The 3D models of physical structures may be generated by a professional or may be automatically generated (e.g., a 3D point cloud may be generated from a 3D camera).

Image data store 220 may store 2D images of physical structures. The 2D images may be captured by professionals or users of the native or web application, or may be generated automatically by a computer (e.g., a virtual image). Referring to the example illustrated in FIG. 1, the image of house 150, which is captured by user device 110, may be transmitted to server 120 and stored in image data store 220. The images stored in image data store 220 may also be stored in association with metadata, such as the focal length of the camera that was used to capture the image, a resolution of the image, or a date and/or time that the image was captured. In some implementations, the images stored in image data store 220 may depict substantially top-down views of physical structures as may be captured by aircraft, satellite images, or drones. Images stored may also be oblique images such as collected from drones, or elevated cameras like vehicle mounted booms or neighboring taller structures. In some implementations, the images stored in image data store 220 may depict rendered 2D projections generated from a 3D model, such as primary orthogonal projections of different faces (front, left, back, right, and top-down) of a structure, optionally with the pixel data corresponding to distance information from the viewpoint or viewpoint plane. In some implementations, the images stored in image data store 220 may depict or correspond to depth images of physical structures or 3D models. The depth images may be synthetically generated (e.g., generated from a 3D model or projection of a 3D model) or may correspond to or be based on depth information that is directly or indirectly determined though one or more physical measurements (e.g., measured using LIDAR imaging or determined based on stereo image pairs).

The images stored in image data store 220 and/or the 3D models stored in 3D model data store 210 may serve as inputs to machine-learning or artificial-intelligence models. The images and/or the 3D models may be used as training data to train the machine-learning or artificial-intelligence models or as test data to generate predictive outputs. Machine-learning or artificial-intelligence models may include supervised, unsupervised, or semi-supervised machine-learning models.

Descriptor data store 230 may be a data structure that stores the various descriptors for the 3D models stored in 3D model data store 210 or for physical structures represented in 3D model data store 210. Each descriptor may be stored with a tag, flag, or other identifying code that can be used to identify the corresponding 3D model or physical structure that is represented by the descriptor. In some implementations, a descriptor may be generated using an image of a top-down view of a physical structure (e.g., a roof). In other implementations, a descriptor may be generated using a synthetic (e.g., virtual) image of a top-down view of a physical structure. In yet other implementations, a descriptor may be generated based on a 3D model of a physical structure that is reconstructed from a two-dimensional (2D) image. In these implementations, a descriptor may be a vector of binary values. For example, a 2D image of a roof of a physical structure or a 3D voxelization of a physical structure may be subdivided into multiple portions. Each vector element may correspond to one of the portions of the subdivided image. The binary value of a vector element of the vector may be determined based on the existence or absence of a structural feature within the portion of the 2D image that corresponds to the vector element. In yet other implementations, a descriptor may be generated using trained machine-learning models, such as an auto-encoder neural network. For example, a descriptor may be or comprise a condensed or encoded representation of the 3D model. The condensed or encoded representation may be generated using an auto-encoder neural network. An auto-encoder neural network may be trained using a training data set of real images, synthetic images, or voxelized 3D models of physical structures. The auto-encoder neural network may produce an encoded representation (e.g., a latent-space representation) at a center layer, retaining certain features of the input image or voxelization. After training, this encoded representation can directly be used as the representative descriptor, or a descriptor element, for the corresponding 3D model.

Figure 3:
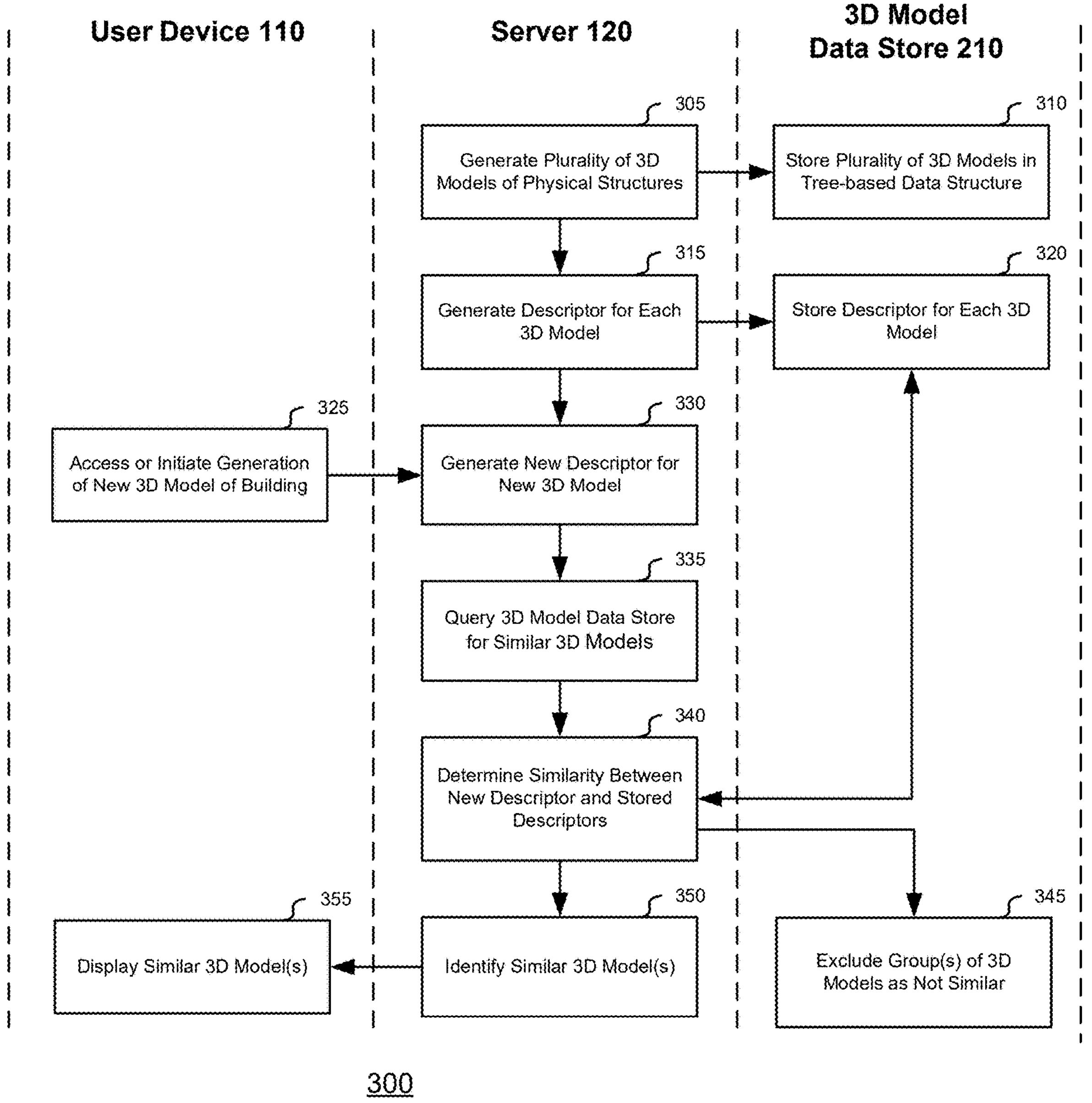
FIG. 3 is a swim lane diagram illustrating an example of a process for querying a database for 3D models that are similar to a new 3D model using descriptors, according to certain aspects of the present disclosure.

FIG. 3 is a swim lane diagram illustrating an example of a process 300 for querying a database for 3D models that are similar to or matching and identical with a new 3D model using descriptors, according to certain aspects of the present disclosure. Process 300 may be performed, at least in part, by any of the components illustrated in FIGS. 1-2, such as user device 110, server 120, and 3D model data store 210. Server 120 may execute process 300 to generate a descriptor that characterizes a new 3D model (e.g., one that is not stored in 3D model data store 210 at the time of querying). As a non-limiting example, the new 3D model may be a volumetric voxelization representing the physical structure of a house. Server 120 may execute process 300 to query 3D model data store 210 to identify existing 3D models (e.g., the 3D models that are stored in 3D model data store 210 at the time of querying) that are structurally similar to the new 3D model of the house. In some implementations, server 120 may determine a structural similarity between the new 3D model and an existing 3D model stored in 3D model data store by determining a Hamming distance between the descriptor of the new 3D model and the descriptor of the existing 3D model.

Process 300 begins with block 305, where server 120 may generate a plurality of 3D models of physical structures. The plurality of 3D models can be generated in any suitable manner, including, but not limited to, by a professional (e.g., creating a 3D CAD drawing) or automatically using a 3D camera (e.g., generating a 3D point cloud as an output of the 3D camera). The plurality of 3D models, or at least a portion thereof, may be accessed from elsewhere, such as a third-party data store. Non-limiting examples of a 3D model of a building include a CAD model, a pseudo-voxelized volumetric representation, mesh geometric representation, a graphical representation, a 3D point cloud, or any other suitable 3D model of a virtual or physical structure. The present disclosure is not limited to server 120 generating the 3D models. A 3D model may be 3D data generated by or from any source, such as 3D data retrieved from a third-party data store. Each 3D model may represent the 3D structure of an existing physical structure.

At block 310, 3D model data store 210 may store the plurality of 3D models representing various physical structures. The plurality of 3D models may be stored in a tree-based data structure that stores the 3D models in a hierarchy relating to structural features. The tree-based data structure is further described with respect to FIG. 6. The 3D models stored in 3D model data store 210 may be of the same or of different types (e.g., volumetric voxelized models and/or 3D point clouds).

At block 315, server 120 may generate a descriptor for each 3D model stored in 3D model data store 210. The descriptor may be generated automatically. For example, server 120 executes executable code that causes a descriptor to be generated, according to any of the implementations described herein. In some implementations, a descriptor may be generated using an image of a top-down view (or a substantially top-down view) of a roof of a physical structure. Other views of the physical structure may be used, instead of the top-down view. In other implementations, a descriptor may be generated using a synthetic (e.g., virtual) image of a top-down view of a roof of a physical structure. In yet other implementations, a descriptor may be generated based on a 3D model of a physical structure, for example, one that is reconstructed from a two-dimensional (2D) image. In yet other implementations, a descriptor may be generated using machine-learning techniques, such as an auto-encoder neural network. Descriptors may be generated using different implementations. For example, a first descriptor may be generated by evaluating a top-down view of a roof of a first physical structure, and a second descriptor may be generated using an auto-encoder neural network. At block 320, the descriptor for each 3D model may be stored. In some implementations, the descriptor for the 3D model is stored in 3D model data store 210. For example, the descriptor may be stored in association with (e.g., in the same record as) the corresponding 3D model that the descriptor represents. In other implementations, the descriptor may be stored separately in descriptor data store 230. For example, each descriptor may be stored with an identifier (e.g., a unique code) that uniquely identifies the 3D model that is represented by the descriptor.

At block 325, user device 110 may access or initiate generation of a new 3D model. The new 3D model may represent the 3D structural features of a new house. The new 3D model may be generated by a professional (e.g., a CAD model) or automatically using a computing device (e.g., a 3D camera to generate a 3D point cloud). Server 120 may retrieve the new 3D model from an internal data source (e.g., internal to a network or system that includes server 120) or an external data source (e.g., from a data source of a third-party network). Non-limiting examples of 3D structural features include gables, roof dimensions, window locations, window trim size, chimney position, porches, gutter locations, fascias, roof ridges, dormers, roof hips, railings, columns, eaves, grids on windows, rakes, and any other structural features.

At block 330, server 120 may generate a new descriptor for the new 3D model. The new descriptor may be generated using any implementation described herein, such as, for example, using an auto-encoder neural network to generate the descriptor. The new descriptor may be stored with the other descriptors (e.g., in 3D model data store 210 or descriptor data store 230, according to the implementation). The elements, and bit depth within an element, may correspond to the presence or arrangement of primitive features (e.g., presence of roofing) within regions or at a specific point on the building or its corresponding model.

At block 335, server 120 may initiate a query of 3D model data store 210 to retrieve 3D models that are structurally similar to or identical with the new 3D model. As part of the querying, process 300 proceeds to block 340, where server 120 may generate a Hamming distance between the new descriptor and one or more descriptors stored in 3D model data store 210 (or stored in descriptor data store 230, depending on the implementation). A Hamming distance is a metric for comparing two binary strings of data, in this case, two descriptors. Server 120 may also calculate a cosine similarity between two descriptor vectors.

While FIG. 3 illustrates the example of server 120 generating a Hamming distance between two descriptors, the present disclosure is not limited thereto. Server 120 may perform any comparison between two descriptors to determine a similarity between the two descriptors. For example, the descriptors may not include binary values, but rather, a descriptor may be a feature vector representing the structural features of the associated 3D model. The feature vectors may be generated using a feature extraction technique. The descriptors (e.g., feature vectors) can be compared in a domain space, such as a Euclidean space or a cosine space. If the distance between two descriptors, which are each represented by a vector, is within a threshold, then server 120 may determine that the two 3D models are similar.

At block 345, 3D model data store 210 may exclude or filter groups of 3D models by traversing a data store, such as a tree-based data structure, in which the 3D models are stored. In some implementations, 3D model data store 210 may organize the descriptors for the 3D models into a tree-based data structure. The tree-based data structure may store the descriptors of the existing 3D models in groups. In some examples, each group of descriptors may be associated with one or more structural features. For example, a group of descriptors for houses with a garage may be defined, and a separate group of descriptors for houses with a porch may also be defined. In performing block 340, a search algorithm may be executed to compare the new descriptor with descriptors of 3D models stored in the 3D model data store 210. The comparison may be performed without the need to compare the new descriptor with the descriptor for each 3D model stored in 3D model data store 210. During the comparison, for example, the Hamming distance between each descriptor assigned to a group associated with a structural feature that is not represented in the new 3D model (or not represented in the new descriptor) may not be calculated. In this case, the group of 3D models associated with the structural feature may be disqualified as not being similar to the new 3D model. In other examples, the Hamming distance between the new descriptor and one or more (but not all) descriptors included in the group may be calculated.

Server 120 may determine that the one or more descriptors included in the group of descriptors are associated with a certain structural feature (e.g., garage) that is not represented in the new 3D model (e.g., the new 3D model has a garage). Server 120 may skip calculating the Hamming distance between the new descriptor and the remaining descriptors in the group because the remaining descriptors are structurally different, given that the 3D models associated with the remaining descriptors have a garage and the new 3D model does not have a garage. Thus, the 3D models represented by the remaining descriptors of the group of descriptors may be disqualified as not being similar without needing to calculate the Hamming distance between the new descriptor and each remaining descriptor of the group.

At block 350, server 120 may identify one or more 3D models that are similar to the new 3D model. In some implementations, server 120 may determine that an existing 3D model is similar to the new 3D model when the Hamming distance between the descriptor representing the existing 3D model and the new descriptor is within a threshold value (e.g., "1," "2," etc.). In some implementations, if a Hamming distance is "2" (or within a threshold) between the descriptor of the existing 3D model and the new descriptor, server 120 may interpret the existing 3D model and the new 3D model as representing the same physical structure. The structural difference (that resulted in the Hamming distance of "2") may be due to non-structural differences, such as noise in the images, intrinsic differences of cameras that captured images resulting in the models, and the like. The extent to which the existing 3D model and the new 3D model differ may be proportional to the calculated Hamming distance between the descriptor of the existing 3D model and the descriptor of the new 3D model. In some examples, when the Hamming distance is with the threshold value, then server 120 may determine that the existing 3D model and the new 3D model are structurally similar (but may not be exactly the same).

At block 355, the similar 3D models identified by server 120 at block 350 may be presented or displayed at user device 110. In some implementations, identifiers of the similar 3D models may be displayed on an interface of a native application executing on user device 110. In other implementations, images of each similar 3D model (e.g., a thumbnail image) may be displayed on the interface of the native application. In yet other implementations, one or more similar 3D models may be displayed on the interface of the native application in full. For example, the interface may display a full CAD model of each similar 3D model identified in block 350.

While FIG. 3 describes the example of calculating the Hamming distance between two descriptors, the present disclosure is not limited to representing similarity between two 3D models using a Hamming distance. Other techniques may be performed to generate a numerical representation of structural similarity between two 3D models. For example, any feature extraction technique may be used to generate a feature vector to represent the structural features of each 3D model. In these examples, two different 3D models can be compared by calculating a distance between the feature vector of the existing 3D model with the feature vector of the new 3D model. The distance may be calculated in a domain space, such a Euclidean distance or a cosine distance.

Figure 4:
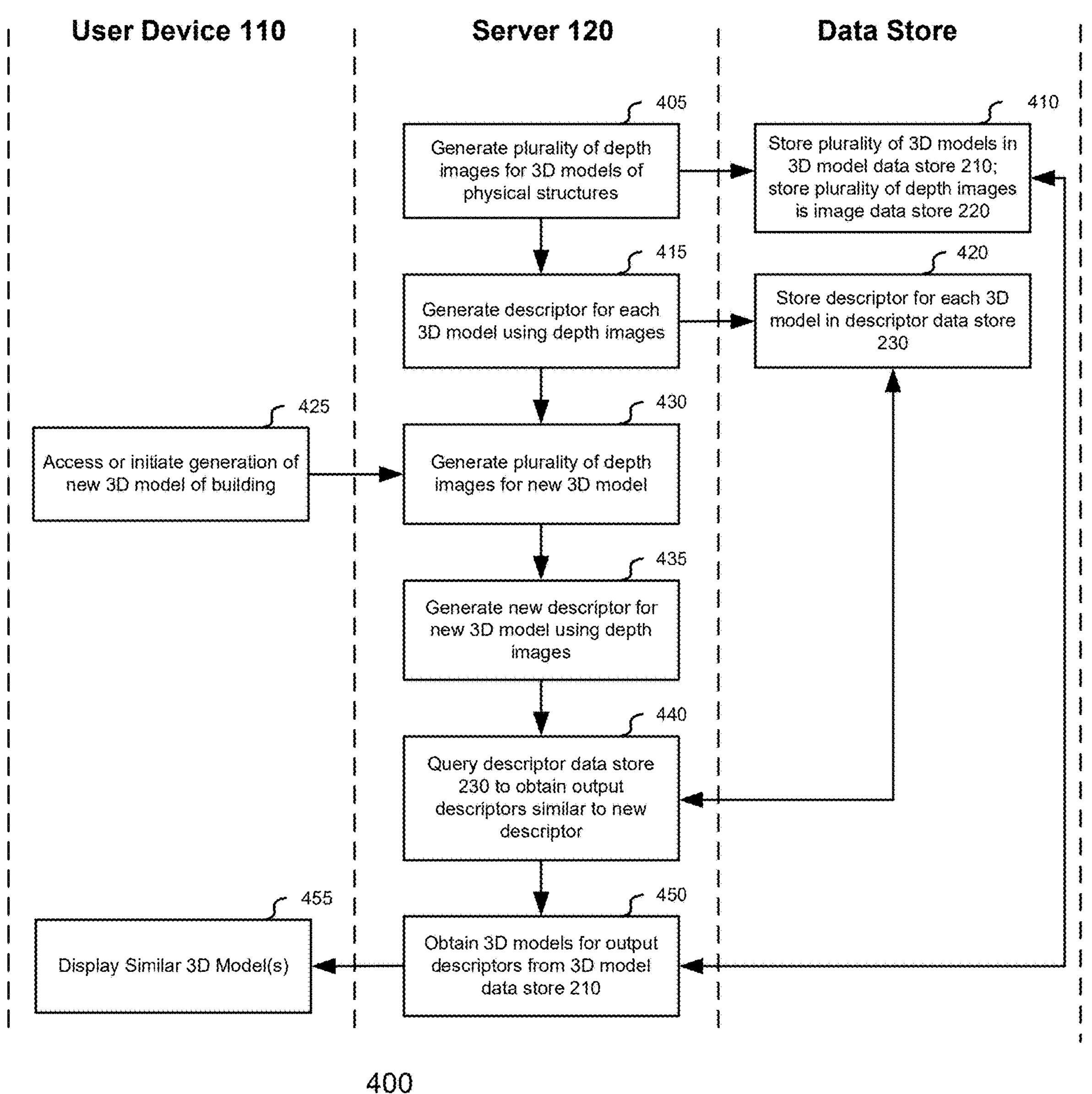
FIG. 4 is a swim lane diagram illustrating an example of a process for identifying 3D models that are similar to a new 3D model using descriptors, according to certain aspects of the present disclosure.

FIG. 4 is a swim lane diagram illustrating an example of a process 400 for identifying 3D models that are similar to or matching and identical with a new 3D model or physical structure using descriptors, according to certain aspects of the present disclosure. Process 400 may be performed, at least in part, by any of the components illustrated in FIGS. 1-2, such as user device 110, server 120, and 3D model data store 210. Server 120 may execute process 400 to generate a descriptor that characterizes a new 3D model or physical structure (e.g., one that is not stored or represented in 3D model data store 210 at the time of querying). Server 120 may execute process 400 to generate descriptors for various 3D models to generate a library of descriptors by first generating or obtaining depth images, using the depth images with a machine-learning model to generate descriptors, storing the descriptors in descriptor data store 230 and optionally storing the 3D models and associated depth images to 3D model data store 210 and image data store 220, respectively. The descriptor data store 230 may be queried using a descriptor for a new 3D model or physical structure to identify existing descriptors (e.g., the descriptors for the 3D models that are stored in descriptor data store 230 at the time of querying) that are similar to the descriptor for the new 3D model or physical structure. In some implementations, server 120 may determine a similarity between the descriptor for the new 3D model or physical structure and an existing descriptor stored in the descriptor data store 230 by using a random forest query or comparing vector elements of the descriptors to identify a vector similarity characteristic of how similar the descriptors are.

Figure 7:
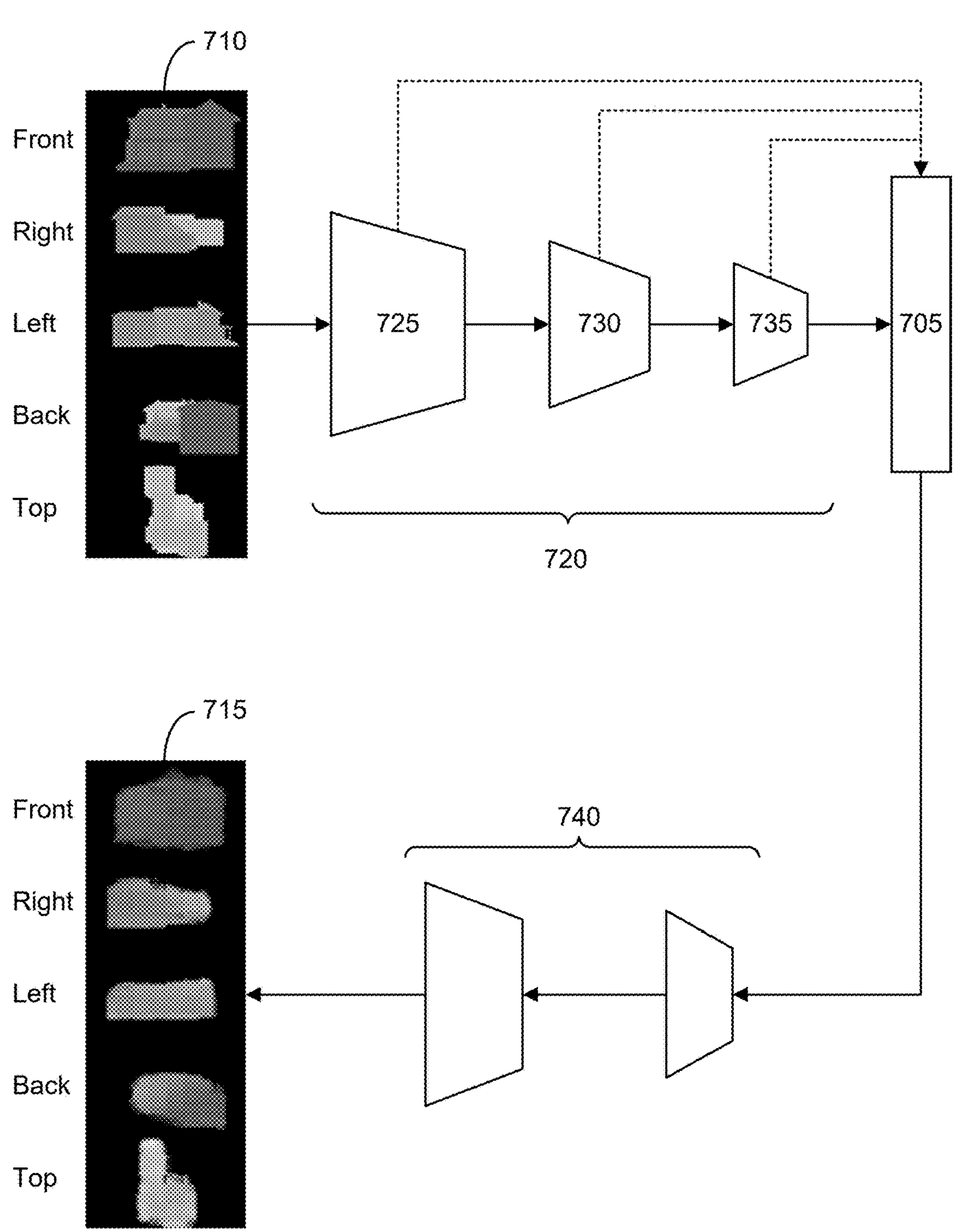
FIG. 7 is a diagram illustrating an example of a process for generating a descriptor using machine-learning techniques, according to certain aspects of the present disclosure.

Process 400 begins with block 405, where server 120 may generate or obtain one or more depth images for 3D models or physical structures. A 3D model can be generated or obtained in any suitable manner, including, but not limited to, by a professional (e.g., creating a 3D CAD drawing) or automatically using a 3D camera (e.g., generating a 3D point cloud as an output of the 3D camera). The plurality of 3D models, or at least a portion thereof, may be accessed from elsewhere, such as a third-party data store. Non-limiting examples of a 3D model of a building include a CAD model, a pseudo-voxelized volumetric representation, mesh geometric representation, a graphical representation, a 3D point cloud, or any other suitable 3D model of a virtual or physical structure. The present disclosure is not limited to server 120 generating the 3D models. A 3D model may be 3D data generated by or from any source, such as 3D data retrieved from a third-party data store. Each 3D model may represent the 3D structure of an existing physical structure. The depth images for the 3D models can be generated by generating two-dimensional (2D) projections of the physical structure from different viewpoints and including pixel information in the images representing distances of a particular pixel from the corresponding viewpoint or viewpoint plane. For example, front-view, left-view, rear-view, right-view, and top-view depth images may be rendered for a 3D model according to a standardized process, such as where the viewpoint is set a fixed distance (e.g., 10 meters from) from the structure or at an arbitrary distance. Depth images for physical structures may correspond to or be based on depth information that is directly or indirectly determined though one or more physical measurements (e.g., measured using LIDAR imaging or determined based on stereo image pairs), for example. Optionally, a depth image may be generated to substantially fill a display area, and not be placed relatively far from the viewpoint such that the structure in the depth image would appear similar at a lower pixel resolution. Depth images with the subject occupying smaller fractional shares of a display area are more likely to depict similar feature mapping across sequential spatial scaling. Without limitation, in some examples, the depth images may correspond to a greyscale image in which a brightest color represents the furthest distance from the viewpoint plane and the darkest color represents the closest distance to the viewpoint plane. FIG. 7 shows some example depth images, wherein a given pixel's intensity refers to a centimeter incremental distance from the camera and contiguous areas with similar pixel colors indicate planar surfaces parallel to the viewpoint plane.

At block 410, 3D model data store 210 may optionally store the plurality of 3D models representing various physical structures. The plurality of 3D models may be stored in a tree-based data structure or other database structure, such as hash tables or lists. The 3D models stored in 3D model data store 210 may be of the same or of different types (e.g., volumetric voxelized models and/or 3D point clouds). At block 410, image data store 220 may optionally store the depth images for the plurality of 3D models or physical structures. The depth images may be stored in a tree-based data structure, similar or identical to how the 3D models are stored in the 3D model data store 210. The depth images may be stored in association with a corresponding 3D model or may include an identifier to allow for later matching of the depth images with a corresponding 3D model.

At block 415, server 120 may generate a descriptor for each 3D model or physical structure. The descriptor may be generated automatically. For example, server 120 executes executable code that causes a descriptor to be generated, according to any of the implementations described herein. In some implementations, a descriptor may be generated using the depth images as input to a machine-learning model that encodes the depth images at a plurality of different spatial scales, as explained further below with reference to FIG. 7. At block 320, the descriptor for each 3D model or physical structure may be stored in descriptor data store 230. In some implementations, the descriptor may be stored in association with the corresponding 3D model or an identifier for a corresponding 3D model or physical structure. For example, the descriptor may be stored in association with (e.g., in the same record as) the corresponding 3D model that the descriptor represents. In some implementations, the descriptor may include an identifier to allow for later identification of the corresponding 3D model or physical structure. For example, each descriptor may be stored with an identifier (e.g., a unique code) that uniquely identifies the 3D model or physical structure that is represented by the descriptor.

At block 425, user device 110 may access or initiate generation of a new 3D model (e.g., a 3D model that is not currently stored in 3D model data store 210). The new 3D model may represent the 3D structural features of a new house. The new 3D model may be generated by a professional (e.g., a CAD model) or automatically using a computing device (e.g., a 3D camera to generate a 3D point cloud). Server 120 may retrieve the new 3D model from an internal data source (e.g., internal to a network or system that includes server 120) or an external data source (e.g., from a data source of a third-party network). Block 425 may alternatively, and optionally, correspond to obtaining physical measurements of a new physical structure, which may be useful for generating a 3D model of the physical structure or one or more depth image(s) of the physical structure. For example, the physical measurements may be photographs, LIDAR measurements, or the like.

At block 430, server 120 may generate one or more depth images for the new 3D model or new physical structure. The depth images may be generated using any suitable implementation, such as by rendering a 2D image of the 3D model from a plurality of different viewpoints and assigning pixel values to the 2D images according to a distance from the viewpoint or viewpoint plane, or generating the depth images from or using the physical measurements of the new physical structure, as described above. At block 435, server 120 may generate a new descriptor for the new 3D model or physical structure. The new descriptor may be generated using any implementation described herein, such as, for example, using a machine learning model with the corresponding depth images as input. The new descriptor may optionally be stored with the other descriptors (e.g., in the descriptor data store 230, as described above). The new descriptor and the existing descriptors stored in descriptor data store 230 may comprise a multi-element vectors where different vector elements can encode or represent different spatial aspects of structural data within the one or more depth images. As examples, each descriptor can comprise 8 or more vector elements, 16 or more vector elements, 32 or more vector elements, 64 or more vector elements, 128 or more vector elements, 256 or more vector elements, 512 or more vector elements, 1024 or more vector elements, etc. The number of vector elements can be any desirable number and need not be a factor of 2. Each vector element can be assigned a value, such as a binary 1-bit value, a 16-bit value, a 32-bit value, a 64-bit value, etc. It will be appreciated that the descriptor may represent an encoded version of some or all of the depth images used to generate the descriptor. In some implementations, the machine-learning model may assign different importances to different features in the depth images or different depth image views based on how the machine-learning model is trained and so some details in the depth images may be lost or diminished on encoding to the descriptors, yet the descriptors may still be useful for comparison purposes to quickly allow similar 3D models to be identified.

At block 440, server 120 may initiate a query of descriptor data store 230 to identify output descriptors representing 3D models that are similar to or identical with the new 3D model or physical structure. Various techniques can be used to query descriptor data store 230. In one example, a vector similarity can be determined between the descriptor for the new 3D model and each descriptor stored in descriptor data store 230. Such a process, however may take significant time, so other, more advanced searching and filtering processes can be used, such as a random forest search or filter algorithm or a decision tree-based search algorithm. Identification of output descriptors may, nonetheless, include determining a vector similarity or similarity magnitude between the descriptor for the new 3D model or physical structure and a proposed output descriptor to determine a closeness of the match. In some cases, if a vector similarity or similarity magnitude meets a threshold (e.g., is less than or equal to a threshold similarity or similarity magnitude), the descriptor may be identified as an output descriptor. In some cases, one or a predetermined number of the closest descriptors (e.g., having the closest similarities or similarity magnitudes) may be identified as output descriptors. While a vector similarity or similarity magnitude between two descriptors is described, the present disclosure is not limited thereto. Server 120 may perform any comparison between two descriptors to determine a similarity between the two descriptors. For example, the different vector components may be assigned different importances during a comparison, so the vector components may be scaled or the similarities between vector components can be scaled, such as according to an assigned weighting factor.

At block 450, server 120 may identify one or more 3D models that are similar to the new 3D model or physical structure based on the output descriptors obtained at block 440. The similar 3D models may be obtained by server 120 from 3D model data store 210. At block 455, the similar 3D models may be presented or displayed at user device 110. In some implementations, identifiers of the similar 3D models may be displayed on an interface of a native application executing on user device 110. In other implementations, images of each similar 3D model (e.g., a thumbnail image) may be displayed on the interface of the native application. In yet other implementations, one or more similar 3D models may be displayed on the interface of the native application in full. For example, the interface may display a full CAD model of each similar 3D model identified in block 450.

Figure 5:
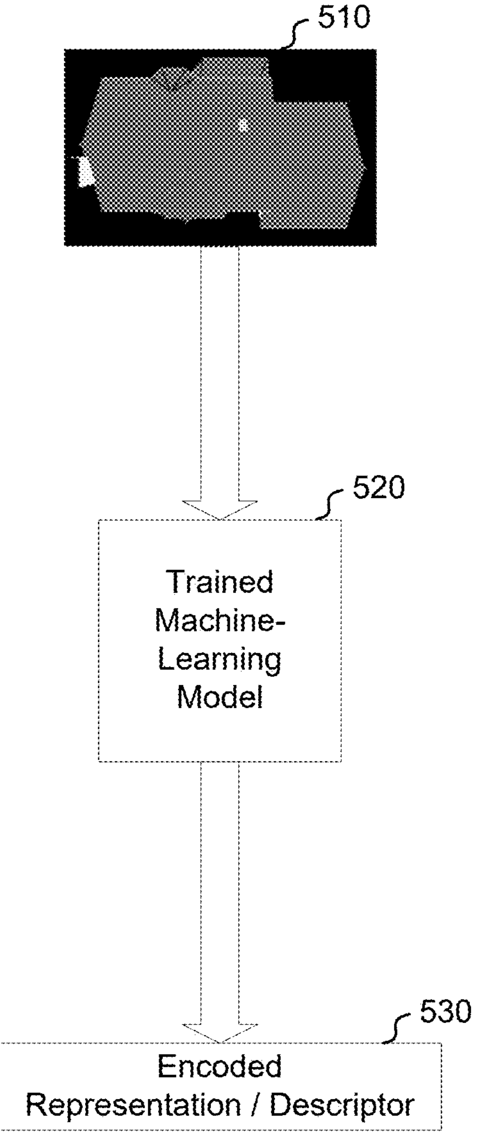
FIG. 5 is a diagram illustrating an example of a process for generating a descriptor using machine-learning techniques, according to certain aspects of the present disclosure.

FIG. 5 is a diagram illustrating an example of a process 500 for generating a descriptor using machine-learning techniques, according to certain aspects of the present disclosure. Process 500 may be performed by any of the components illustrated in FIGS. 1-2, such as server 120. Process 500 may be performed to generate a descriptor to numerically represent characteristics of an object, such as a house, depicted in an image.

In some implementations, image 510 may be a top-down view of a roof of a house. The top-down view may be captured using a camera (e.g., a real image of a roof captured using a camera attached to a drone or a satellite camera) or may be a virtual image (e.g., a synthetic image that depicts a roof of a building). Image 510 may be passed into trained machine-leaning model 520 for generating a descriptor for the house represented in image 510.

Trained machine-learning model 520 may be any machine-learning model that is trained to generate an encoded representation of an input image. As a non-limiting example, trained machine-learning model 520 can be an auto-encoder neural network trained to generate an encoded representation of input images. An auto-encoder neural network may be trained on a training data set of synthetic images of roofs, real images of roofs, or voxelized 3D models of roofs. The trained machine-learning model 520 (e.g., an auto-encoder neural network) may produce an encoded representation 530 of the input image (or voxelization) at the center layer. For example, the encoded representation may be a latent-space representation of the input image. The encoded representation 530 may serve as the descriptor for the building depicted in image 510. Further, the encoded representation may retain a subset of features of the roof depicted in image 510.

The layout of a roof of a building may be representative of certain structural features or the configuration of a building. For example, a top-view image of a roof may depict the building dimensions, a roof topology, the locations of eaves, roof apexes, gables, and so on. These structural features (and others) can be detected from a top-down view image of a building using trained machine-learning model 520. The output of trained machine-learning model 520 can be used to identify any number of similar 3D models stored in 3D model data store 210. Further, two condensed or encoded representations (e.g., of two different 3D models) may be characterized by a distance between the two condensed or encoded representations. The distance can be calculated by plotting the condensed or encoded representation 530 as a vector in a domain space (e.g., Euclidean space or cosine space).

Encoded representation 530 may be a latent-space representation of input image 510. The encoded representation 530 may represent structural features of the top-down view of the building depicted in image 510. Such a descriptor is a semantic-based descriptor, as compared to the geometric based machine learning descriptor described elsewhere in this disclosure, with the geometric nature of such a descriptor referring to the depth image pixels' geometric relationship (distance) to the viewpoint. Trained machine-learning model 520 may be trained by using the model to recreate the input image, while constraining the number of variables (e.g., dimensions) that the model can use to represent the input image internally. The latent-space representation of the input image may be the representation of the input image that uses the reduced number of variables to represent the input image. Thus, the latent-space representation of the input image 510 numerically represents certain structural features (e.g., the structural features that the model learned were important from the training data set). The latent representation may indicate the presence of structural features and their positional configuration in the 2D image. Further, the latent representation is not humanly interpretable. A decoder (not shown) may also be provided to reconstruct the original image using the latent-space representation of the input image 510.

Figure 6:
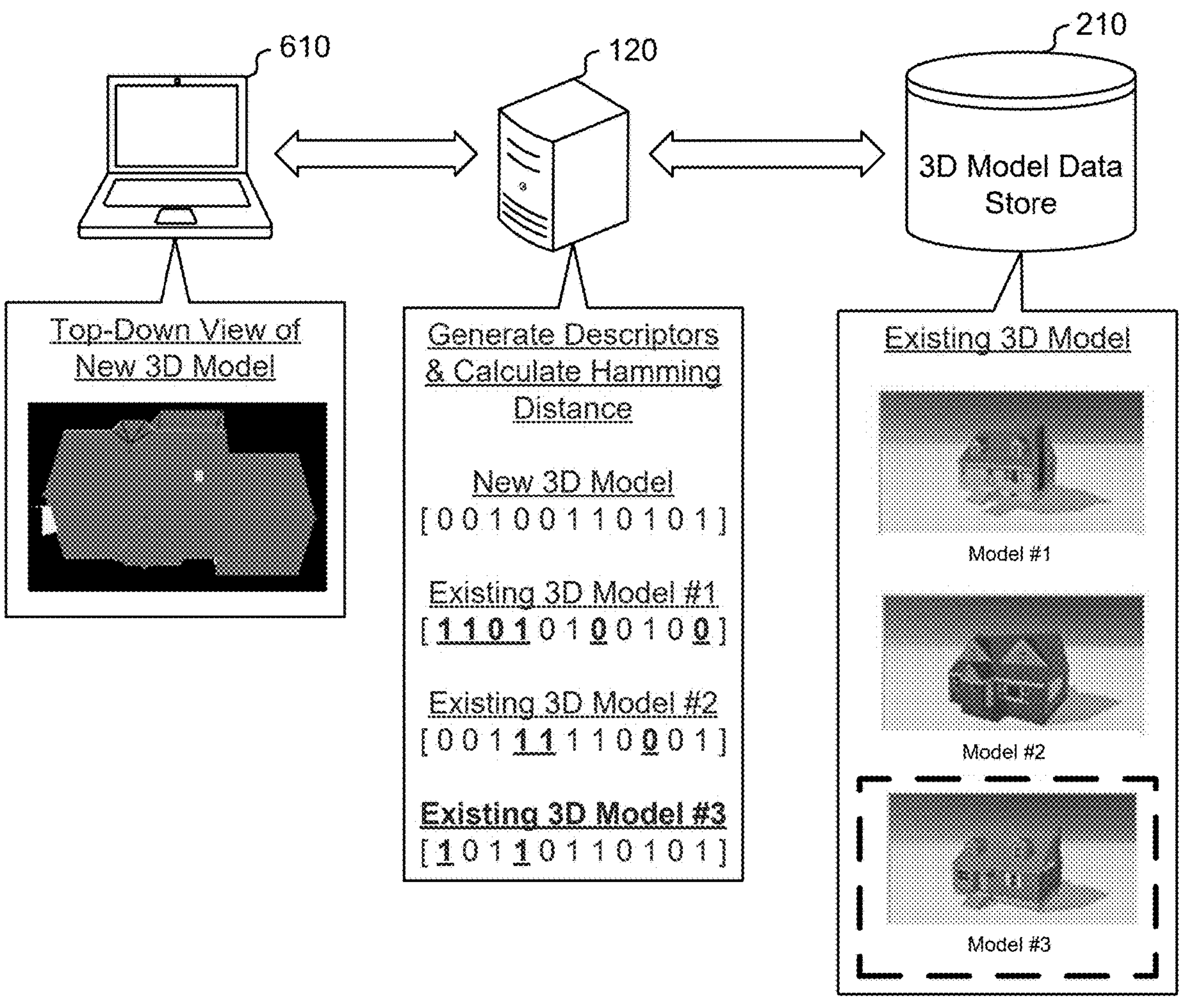
FIG. 6 is a diagram illustrating an example of a process for determining a similarity between two descriptors, according to certain aspects of the present disclosure.

FIG. 6 is a diagram illustrating an example of a process for determining a similarity between two descriptors, according to certain aspects of the present disclosure. Process 600 may be performed by any of the components illustrated in FIGS. 1-2, such as server 120. Process 600 may be performed to generate a Hamming distance between two descriptors. The Hamming distance may be used in certain implementations to represent the structural similarity between two different 3D models, however, the present disclosure is not limited thereto.

User device 610 may receive an image depicting a top-down view of a new 3D model of a house. The image of the top-down view of the new 3D model, as shown in FIG. 6, is a virtual image created using a CAD program. The present disclosure, however, is not limited thereto. In some implementations, the image may be a real image, such as an image of a top-down view of a real building (e.g., captured by satellite or drone). In other implementations, the image may be a 3D voxelization of the new 3D model.

Server 120 may generate a descriptor to characterize the structural features depicted in the image of the top-down view of the new 3D model. In implementations where the image is a synthetic (e.g., virtual) top-down view of the new 3D model, metadata of the image may be used to normalize the orientation of the image. For example, metadata may include data representing a front outward facing vector of the new 3D model. The front outward facing vector of the new 3D model can be used to normalize the orientation of the new 3D model. Any vector or metadata of the top-down view of the new 3D model can be used to normalize the orientation of the new 3D model. The synthetic image may be divided into N tiles. As a non-limiting example, the tiles may have a size of 16×16 pixels. However, the size of the tiles can be any number of pixels. For each tile of the N tiles, server 120 may determine which subset of structural features is contained in the tile. For example, the existence or absence of a particular structural feature (e.g., a corner of a window) within the pixels of a tile may be represented by a bit (e.g., a binary value). The N bits for the N tiles can be concatenated to generate the final descriptor that represents the image.

In implementations where the image is a real image (e.g., an image captured by a camera), server 120 may perform semantic segmentation or object detection on the image to identify salient roof structures, such as ridge lines, apexes, presence of roof, and so on. As an output, a synthetic image with certain structural information may be generated. The synthetic image may be akin to a synthetic image generated from the top-down view of the new 3D model. Based on the angle of certain lines in the synthetic image (e.g., key lines), server 120 may rotate the image to a normalized orientation. Server 120 may divide the synthetic image into N tiles, as described above. For each tile, server 120 may determine which subset of structural features is contained in the pixels of the tile. For example, the existence or absence of a particular structural feature within the pixels of a tile may be represented by a bit (e.g., a binary value). The N bits for the N tiles can be concatenated to generate the final descriptor that represents the image.

In implementations where the image is a 3D voxelization (e.g., a voxelization reconstructed from a 2D image of a building), server 120 may evaluate metadata of the image to normalize the orientation of the image. For example, the metadata may include a 2D projection of a ridgeline of a roof onto the ground plane. Server 120 may then use the 2D projection of the ridgeline to rotate the new 3D model to a normalized orientation (e.g., 0 degrees, 90 degrees, or any orientation). For each voxel of the 3D voxelization, server 120 may determine which subset of structure features are detected within the voxel. For example, the existence or absence of a particular structural feature (e.g., a window or a portion of a window) within the voxel may be represented by a bit (e.g., a binary value). The N bits for the N voxels of the 3D voxelization can be concatenated to generate the final descriptor that represents the image.

After server 120 has generated the descriptor for the new 3D model, server 120 may calculate the Hamming distance between the descriptor of the new 3D model and each descriptor of an existing 3D model stored in 3D model data store 210. While FIG. 6 illustrates three existing 3D models (e.g., Model #1, Model #2, and Model #3), the present disclosure is not limited thereto. Any number of models can be stored in 3D model data store 210 and evaluated against the new 3D model using the implementations described herein. Referring again to the comparison of descriptors illustrated in FIG. 6, the Hamming distance between the descriptor of the new 3D model and the descriptor of existing 3D model #1 may be "6." The bits that differ between the descriptors are bolded and underlined in FIG. 6. The Hamming distance between the descriptor of the new 3D model and the descriptor of existing 3D model #2 may be "3." Lastly, the Hamming distance between the descriptor of the new 3D model and the descriptor of existing 3D model #3 may be "2." The existing 3D model with the smallest Hamming distance to the descriptor of the new 3D model is existing 3D model #3. Thus, server 120 selects existing 3D model #3 as the most structurally similar 3D model to the new 3D model.

FIG. 7 is a diagram illustrating an example of a process 700 for generating a descriptor 705 by encoding one or more depth images 710 using machine-learning techniques, according to certain aspects of the present disclosure. FIG. 7 also shows decoding of a descriptor 705 to generate decoded depth image(s) 715, such as for purposes of visualization or validation. Process 700 may be performed by any of the components illustrated in FIGS. 1-2, such as server 120. Process 700 may be performed to generate a descriptor 705 to numerically represent characteristics of an object, such as a house.

In some implementations, depth images 710 may be primary orthogonal views of the faces of a house, generated by rendering images of a 3D model from appropriate viewpoints and assigning pixel values to the images according to a distance from the viewpoint or viewpoint plane. In some implementations, depth images 710 may correspond to or be based on depth information that is directly or indirectly determined though one or more physical measurements (e.g., measured using LIDAR imaging or determined based on stereo image pairs). Appropriate viewpoint selection may include rendering or adjusting the depth images to fit within and be cleanly enveloped as a convex hull within an image frame to ensure geometric bounds and features of the depth image are represented by as many pixels available within the frame. Depth images 710 may be passed into trained machine-leaning model 720 for generating a descriptor for the house represented in depth images 710.

Trained machine-learning model 720 may be any machine-learning model that is trained to generate an encoded representation of an input image. As a non-limiting example, trained machine-learning model 720 can be an auto-encoder neural network trained to generate an encoded representation of input images. An auto-encoder neural network may be trained on a training data set of depth images, similar to depth images 710. The trained machine-learning model 720 (e.g., an auto-encoder neural network) may analyze and encode the depth images 710 using different spatial scale encoders 725, 730, 735 to produce different encoded representations at different spatial scales, which are fed into the descriptor 705 as well into the other spatial scale encoders.

In some examples, the first spatial scale encoder 725 may receive the depth images 710 and perform at least one convolution with a learned kernel (e.g. a 2×2 kernel, 3×3, etc). The convolution produces an encoded representation of the depth images 710, forming the first part of the descriptor. Such an encoded or downsampled representation may be akin to reduced-resolution images, but the data values for each pixel in the reduced-resolution images may not necessarily correspond to specific depth values, as they do in the depth images 710, though such an embodiment is contemplated. Instead, the values for the data encoded at a given spatial scale may be values determined according to the training parameters established for the machine learning model 720 during the training process and an encoding process, such as a feedforward convolutional image encoding process. In some examples, the representation at a given spatial scale may correspond to a reduction in resolution by an integer factor (e.g., 2) for each of the horizontal and vertical dimensions of the depth images 710, such reduction a function of the kernel and stride size of the convolution. When a plurality of depth images 710 are available for a physical structure or 3D model, such as each of a plurality of different orthogonal views of depth images (e.g., front, right, left, back, top), the depth images 710 may be processed independently or they may be processed together.

Instead of using the depth images 710, other spatial scale encoders, such as spatial scale encoders 730 and 735, may receive as input an encoded representation of the depth images 710 generated by a previous spatial scale encoder to generate a further encoded representation of the input with the spatial scale reduced further. In some embodiments, more than one convolution is performed on an input: a first to generate the encoded data for the descriptor at that spatial scale, and a second to generate a representation for a subsequent spatial scale. The kernel and stride size may differ between these convolutions. For example, spatial scale 725 may perform a convolution with a 3×3 kernel with a stride of 1 to generate the encoded data for the descriptor at that spatial scale, as well as perform a convolution with a 2×2 kernel with a stride of 2 to generate a representation fed into the next spatial scale (e.g. spatial scale 730). The encoded representation of the depth images 710 generated by the various spatial scale encoders 725, 730, 735 may be compiled as elements of descriptor 705. In some embodiments, a descriptor is a concatenation of each spatial scale's encoded output (indicated by the dashed line of FIG. 7).

Descriptor 705 can also be used to generate decoded depth images 715, such as for purposes of visualization or use while training the machine-learning model 720. A decoding process 740 can correspond to processes by which details of depth images 710 are reconstructed and may include, for example, spatial scale reconstruction processes. A comparison between depth images 710 and decoded depth images 715 shows that some detailed information in the images is lost but that high-level information (e.g., overall silhouette shape and some depth information) is retained. In some cases, the difference between depth images 710 and decoded depth images 715 can be used to adjust the machine-learning model as part of a training process, where various parameters used by the machine-learning model (e.g., spatial scale dimensions, weighting factors, etc.) can be adjusted and then the depth images 710 can be reprocessed by the adjusted machine-learning model to generate an adjusted descriptor, that can then be used to reconstruct adjusted decoded depth images to evaluate if the performance of the adjusted machine-learning model. This process may be iterated any desirable number of times, and optionally using any desired number of source 3D models or physical structures and corresponding depth images. The decoded images may be built according to a standard regression loss, or until linear contours within the depth image may be rendered.

Figure 8A:
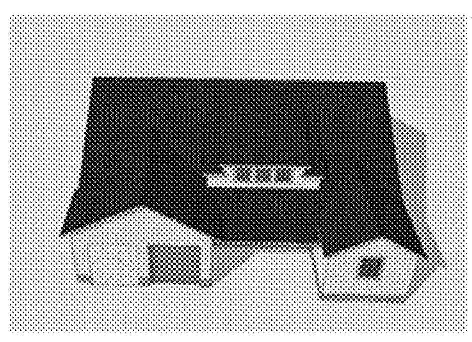
FIG. 8A provides an example of a 3D model.
Figure 8B:
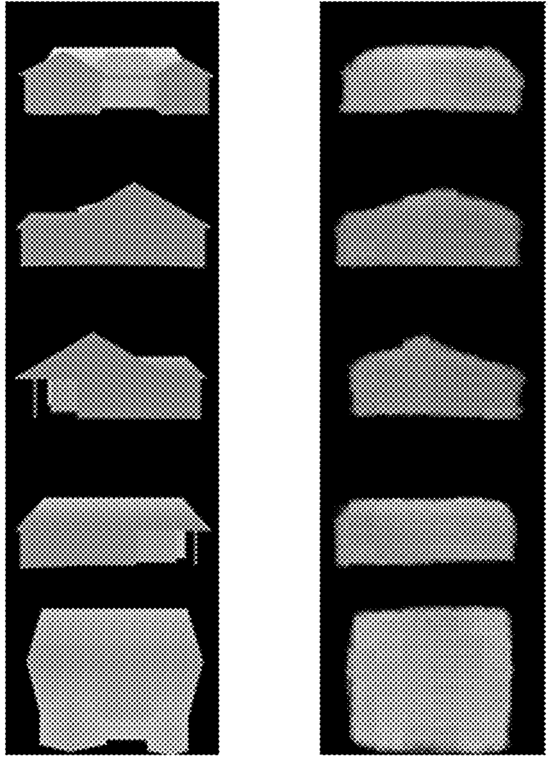
FIG. 8B provides examples of a group of depth images generated from the 3D model and their decoded representations.
Figure 8C:
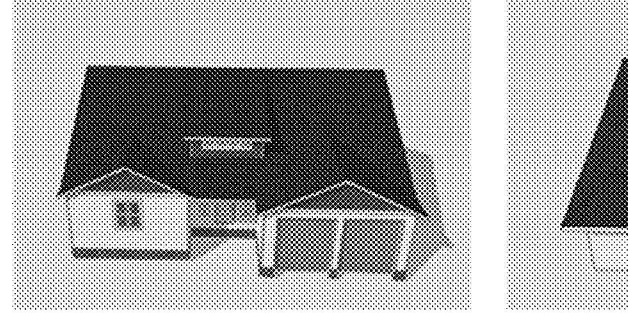
FIG. 8C provides two example 3D models identified as similar to the 3D model depicted in FIG. 8A, identified using the descriptor prepared using the group of depth images depicted in FIG. 8B.
Figure 8C:
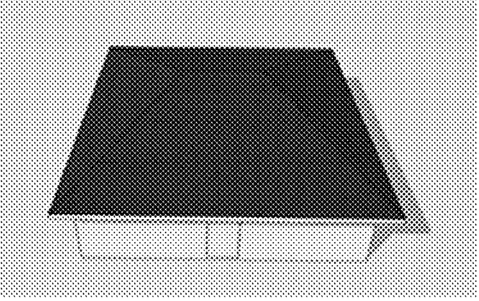
Figure 9:
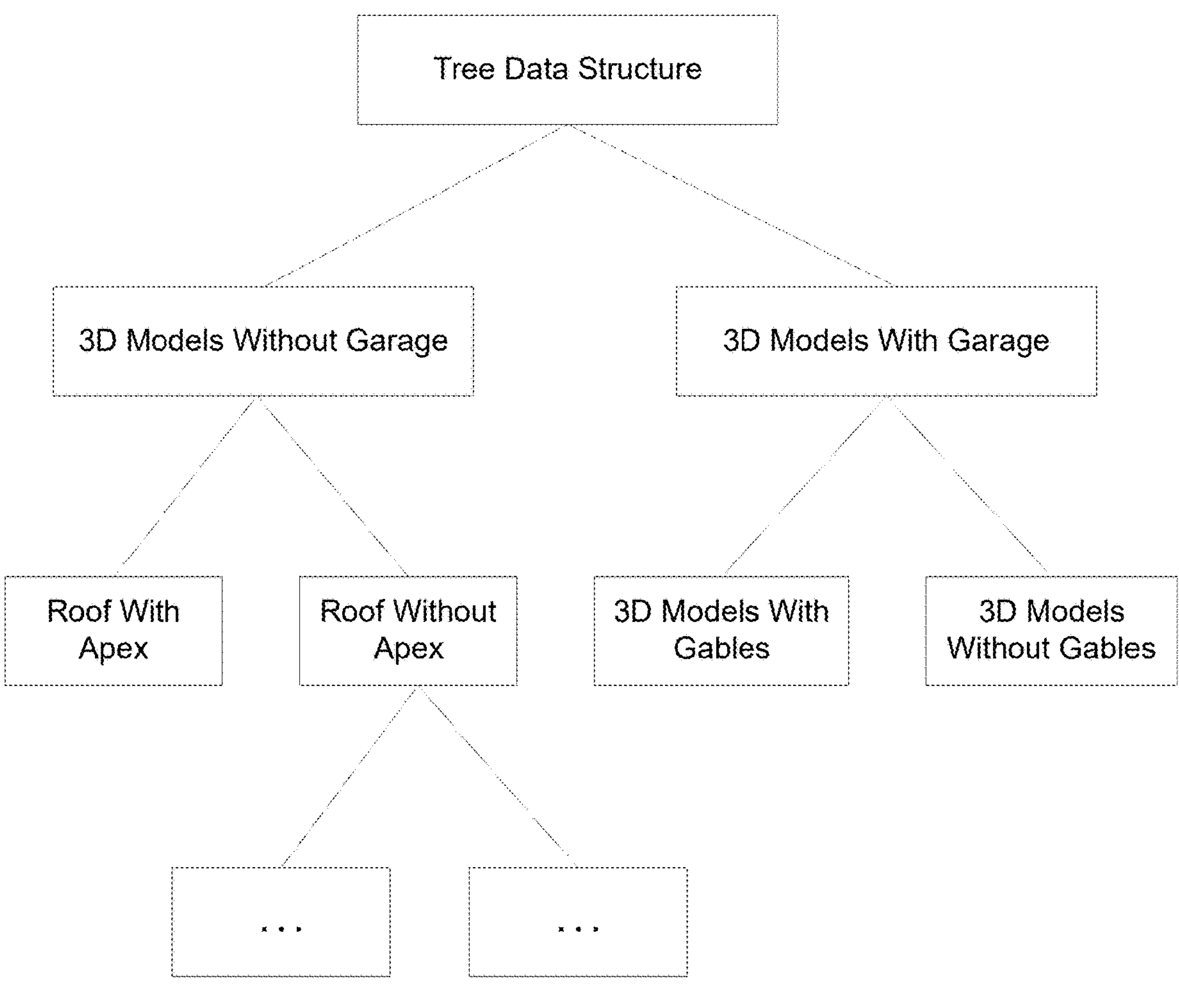
FIG. 9 is a diagram illustrating an example of a data structure for storing 3D models of physical structures, according to certain aspects of the present disclosure.

FIG. 8A provides an example render of a house from a 3D model processed according to the techniques described herein to identify similar 3D models. The 3D model can be used to generate a plurality of depth images, as described above, with the resultant depth images shown on the left panel of FIG. 8B. These depth images can be processed using a trained-machine learning model to generate a descriptor for the 3D model, which can be used for purposes of identifying similar 3D models, according to the techniques described herein. For purposes of illustration, the descriptor prepared using a trained machined-learning model is used to generate decoded depth images, shown on the right panel of FIG. 8B. Using the descriptor, a search of a database of existing descriptors for existing 3D models is performed to identify the descriptors for the top two closest 3D models. These descriptors can, in turn, be used to identify the corresponding 3D models, and renders of these are depicted in FIG. 8C. As illustrated, the 3D model in the left panel of FIG. 8C is very similar to that depicted in FIG. 8A, though a mirror image reflection of the structure could be an even closer match. In some examples, mirror image reflections are directly considered by the machine learning model in the process of generating depth images, generating descriptors, or querying a data store of existing descriptors to find similar 3D models. The right panel of FIG. 8C does not appear to be as close of a match as on the left panel, but there are similar structural aspects and the machine-learning and searching process can be trained or include certain weighting factors to avoid or include results like the right panel of FIG. 8C, as desired. For example, in some circumstances, the encoding process can identify the 3D model in FIG. 8A as including a garage, while that in FIG. 8C can be identified as lacking a garage. In cases where a garage is an essential feature to identify similarity, the searching or filtering process can explicitly include flags to avoid models lacking a garage. Adjusting the kernel size or number of spatial scales, or both, will further adjust the query results; for example, smaller kernel sizes and additional spatial scaling layers are more likely to produce descriptors for results that are more similar to the input of FIG. 8A, and similarly more likely to exclude descriptors that would return results as in the right panel of FIG. 8C FIG. 9 is a diagram illustrating an example of a data structure for storing 3D models of physical structures, according to certain aspects of the present disclosure. Data structure 1000 may be used for storing existing 3D models in 3D model data store 210. Data structure 1000 may also be used to store descriptors in descriptor data store 230. Data structure 1000 may be configured to organize the existing 3D models in groups to improve the computational efficiency of querying the 3D model data store 210. For example, data structure 1000 may organize the existing 3D models that include a garage into a group. The existing 3D models that do not include a garage can be organized into a different group. Sub-groups may be defined for each group. For example, the group of existing 3D models may be further divided into a sub-group of existing 3D models with gables and another sub-group of existing 3D models without gables. Organizing the existing 3D models into groups may be performed by storing a set of records in 3D model data store 210 in a hierarchical structure according to structural features. Each record of the set of records may store data representing an existing 3D model and the corresponding metadata (e.g., network location of the associated descriptor, and so on) for that existing 3D model. Further, each record may store code representing a tag or identifier that indicates the grouping associated with that existing 3D model. In some implementations, server 120 does not compute the Hamming distance for every single 3D model in the database due to the specialized tree-based data structure illustrated in FIG. 9. The specialized tree-based data structure significantly speeds up the querying. For example, at every step starting at the root of the tree-based data structure, a subgroup of existing 3D models may be disqualified based on the subset of bits that are associated with that node of the tree. By the time a leaf node of the tree-based data structure is reached, a single 3D model (e.g., the closest match) remains. In some implementations, querying may include comparing the new descriptor's bit-vector and a set of rules for each node to determine whether the bit-vector is more similar to group A or group B within that node. This process may be performed recursively until a leaf node is reached, and a 3D model remains (e.g., the closest match).

To illustrate and only as a non-limiting example, server 120 may query data structure 1000 for existing 3D models that are similar to a new 3D model. If the new 3D model does not have a garage, server 120 does not compare the descriptor of the new 3D model with the descriptors of the existing 3D models associated with the "3D models with garage" group. The existing 3D models associated with the "3D models with garage" group are disqualified from being similar to the new 3D model due to the differences in structural features (in particular, the lack of a garage in the new 3D model as compared to the existence of a garage in the existing 3D models associated with the group). Server 120 compares the new descriptor against the descriptor of each of the existing 3D models associated with the "3D models without garage" group, which reduces the number of actions taken as part of the querying for similar 3D models.

Figure 10:
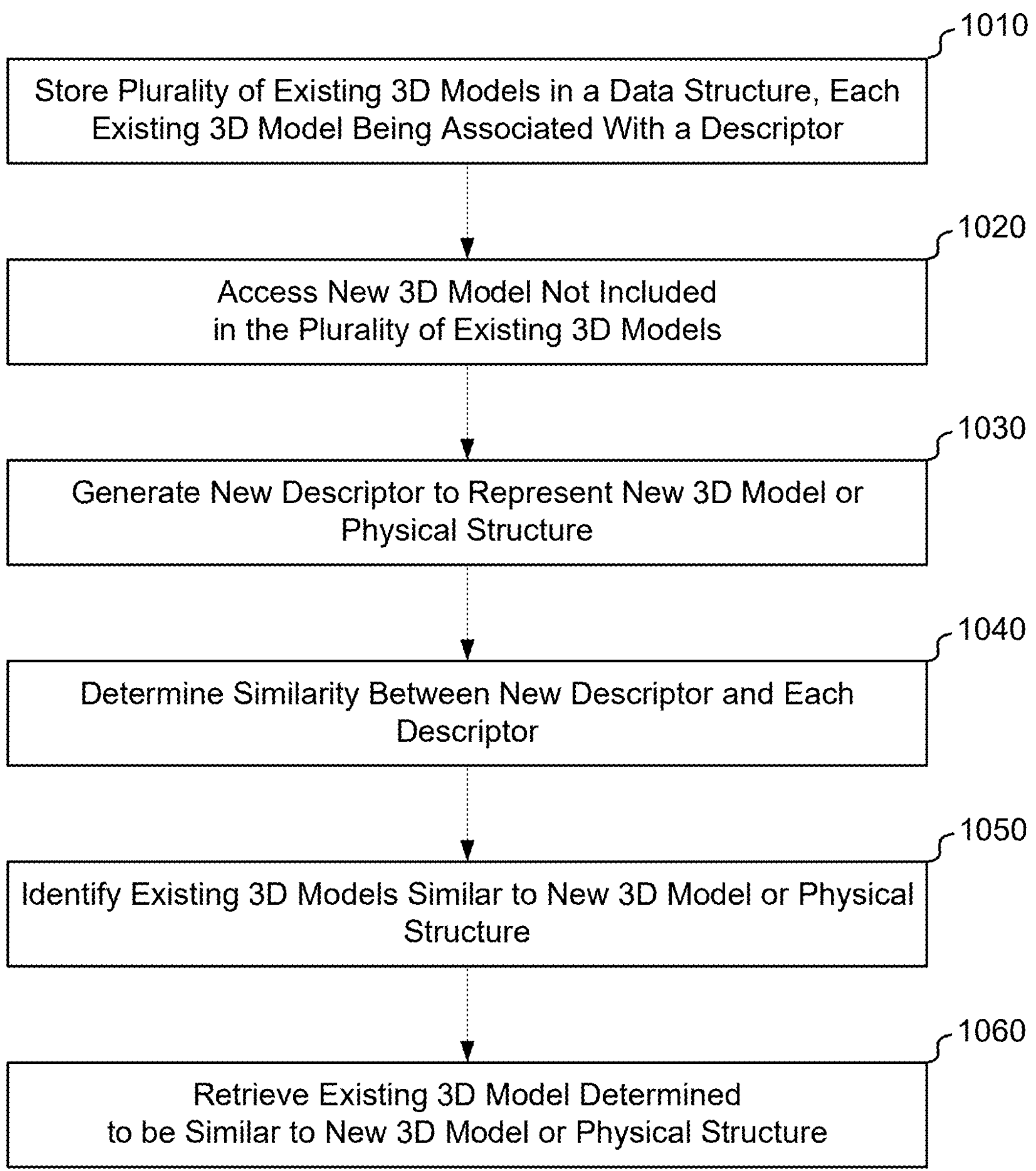
FIG. 10 is a flowchart illustrating a process for identifying 3D models that are similar to a new 3D model, according to certain aspects of the present disclosure.

FIG. 10 is a flowchart illustrating a process 1000 for identifying existing 3D models that are structurally similar to a new 3D model, according to certain aspects of the present disclosure. Process 1000 may be performed by any of the components illustrated in FIGS. 1-2, such as server 120. Process 1000 may be performed to identify one or more existing 3D models that are structurally similar to a new 3D model from amongst a set of existing 3D models stored in 3D model data store 210. As a technical solution to above-described technical challenges, server 120 may perform process 1000 to identify a subset of existing 3D models from the set of existing 3D models stored in 3D model data store 210. Each existing 3D model of the subset of 3D models is structurally similar to a new 3D model (for which there may not be a corresponding existing 3D model stored in 3D model data store 210 at the time of querying).

Process 1000 begins at block 1010, where a plurality of existing 3D models are stored in 3D model data store 210. The existing 3D models may be organized in a data structure, such as data structure 900. Each existing 3D model may be associated with a descriptor. The descriptors can be stored in 3D model data store 210 or in another storage location, such as descriptor data store 230. Further, the descriptors may be generated by server 120 using any of the implementations described herein (e.g., implementations as described with respect to FIG. 6 or FIG. 7).

At block 1020, server 120 may access a new 3D model (e.g., a 3D model for which a corresponding existing 3D model may not exist in 3D model data store 210). In some implementations, instead of accessing the new 3D model, server 120 may receive, retrieve, or generate the new 3D model. At block 1030, server 120 may generate a new descriptor for the new 3D model. Any of the implementations described herein may be used to generate the descriptor. At block 1040, server 120 may determine the difference between the new descriptor and the descriptor of each existing 3D model. In some implementations, the difference or similarity between two descriptors may be characterized by a Hamming distance. In other implementations, the difference or similarity between two descriptors may be represented by a distance between two vectors in a Euclidean or cosine domain space. The difference or similarity between the new descriptor and an existing descriptor represents the structural similarity between the new 3D model and the existing 3D model associated with the existing descriptor.

At block 1050, server 120 may identify the existing 3D models that are similar to the new 3D model based on the differences or similarities between descriptors that were determined at block 1040. For example, server 120 may determine that an existing 3D model is similar to the new 3D model when the Hamming distance between the existing descriptor associated with the existing 3D model and the new descriptor associated with the new 3D model is less than or equal to a threshold value. As another example, for descriptors represented in a Euclidean or cosine space (e.g., feature vectors generated using feature extraction techniques), server 120 may determine that an existing 3D model is similar to the new 3D model when the Euclidean distance (or the cosine distance, respectively) between the vector of the existing descriptor and the vector of the new descriptor is less than or equal to a threshold value.

At block 1060, server 120 may retrieve the existing 3D models that were determined to be similar at block 1050. In some implementations, the existing 3D models that were determined to be similar may be transmitted to user device 110 for displaying to a user. The user may interact with the displayed existing 3D models, for example, by rotating a displayed existing 3D model to view different angles of the building depicted by the existing 3D model. In other implementations, server 120 may transmit metadata associated with the existing 3D models that were determined to be similar to the new 3D model. For a given existing 3D model that is similar to the new 3D model, the metadata may include a unique identifier, a thumbnail image, information about the house depicted by the existing 3D model (e.g., a street address), a 2D floor plan of the existing 3D model, a 2D image of the house depicted by the existing 3D model, and the like.

Figure 11:
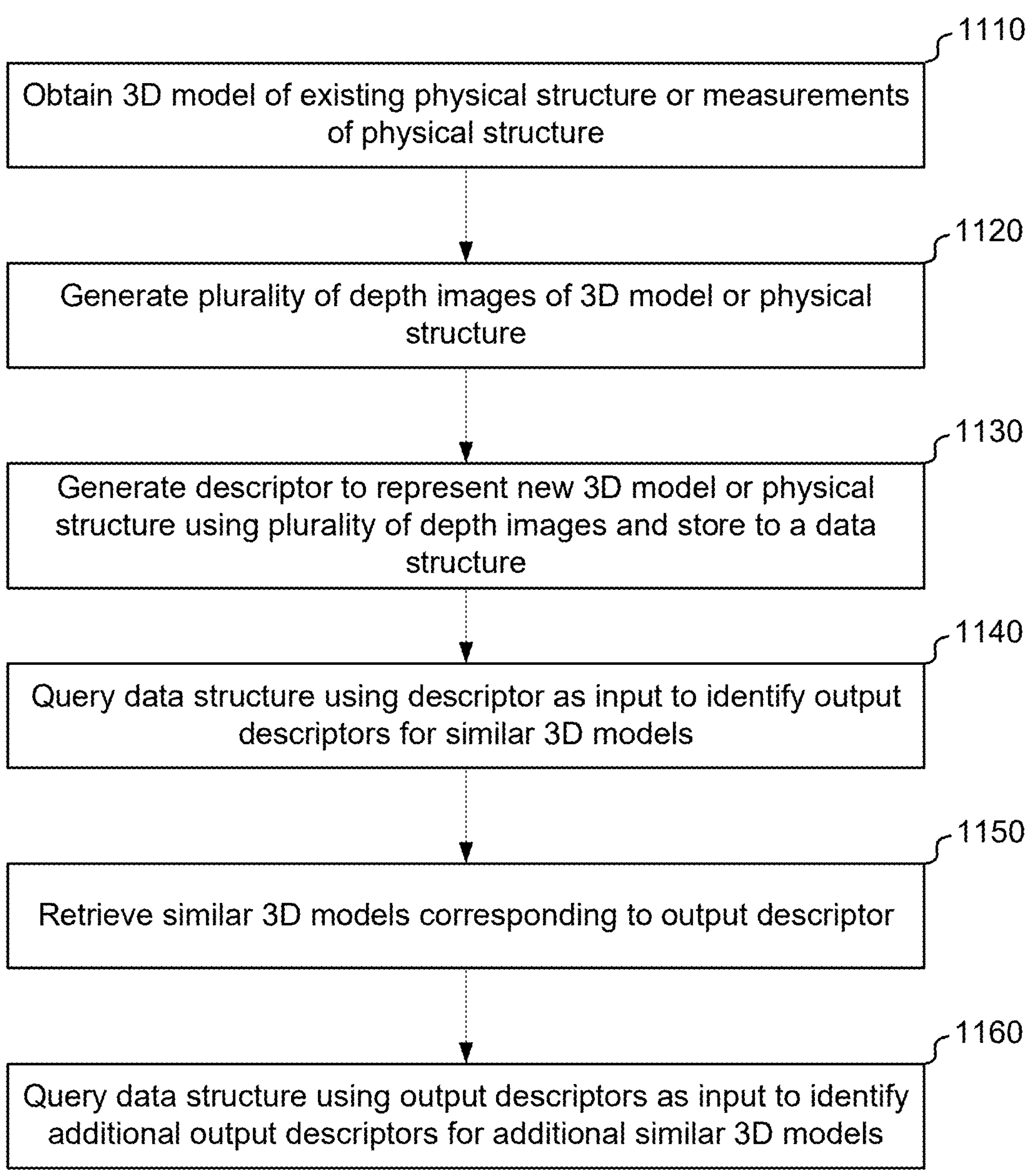
FIG. 11 is a flowchart illustrating a process for identifying 3D models that are similar to a new 3D model, according to certain aspects of the present disclosure.

FIG. 11 is a flowchart illustrating a process 1100 for identifying existing 3D models that are similar to a new 3D model, according to certain aspects of the present disclosure. Process 1100 may be performed by any of the components illustrated in FIGS. 1-2, such as server 120. Process 1100 may be performed to identify one or more existing 3D models that are similar to a new 3D model from amongst a set of existing 3D models stored in 3D model data store 210.

Process 1100 begins at block 1110, where server 120 may obtain a new 3D model (e.g., a 3D model for which a corresponding existing 3D model may not exist in 3D model data store 210). In some implementations, server 120 may receive, retrieve, or generate the new 3D model.

At block 1120, server 120 may generate a plurality of new depth images of the new 3D model. The new depth images and the new 3D model may be stored in appropriate data stores, as desired, such as 3D model data store 210 and image data store 220, respectively. 3D model data store 210 may be populated with existing 3D models, image data store 220 may be populated with existing depth images, and descriptor data store may 230 be populated with existing descriptors.

At block 1130, server 120 may generate a new descriptor for the new 3D model using the plurality of new depth images. Any of the implementations described herein may be used to generate the new descriptor. At block 1140, server 120 may query the descriptor data structure to identify output descriptors which may represent similar 3D models as the new 3D model. In some implementations, the query process may use a random forest search or filter algorithm, or implement one or more decision tree-based searches. Optionally, differences or similarities between two descriptors may be determined, which may correspond to a vector similarity between a first vector corresponding to the new descriptor and a second vector corresponding to an output descriptor. The vector similarity between the new descriptor and an output descriptor represents the similarity between the new 3D model and the existing 3D model associated with the output descriptor. In some cases, vector differences or similarities between the new descriptor and any output descriptors identified by the query process can be determined, such as for purposes of ranking the output descriptors to ensure they meet a similarity criteria.

At block 1150, server 120 may retrieve the existing 3D models that are similar to the new 3D model based on the output descriptors that were determined at block 1140. In some implementations, the existing 3D models that were determined to be similar may be transmitted to user device 110 for displaying to a user. The user may interact with the displayed existing 3D models, for example, by rotating a displayed existing 3D model to view different angles of the building depicted by the existing 3D model. In other implementations, server 120 may transmit metadata associated with the existing 3D models that were determined to be similar to the new 3D model. For a given existing 3D model that is similar to the new 3D model, the metadata may include a unique identifier, a thumbnail image, information about the house depicted by the existing 3D model (e.g., a street address), a 2D floor plan of the existing 3D model, a 2D image of the house depicted by the existing 3D model, and the like.

In some instances, the query process may identify a number of output descriptors less than a target number. Optionally, the query process may be repeated, such as using one or more of the output descriptors obtained at block 1140 as input to the query process to obtain additional output descriptors. In this way, the query process can identify a suitable number of output descriptors. In some cases, these additional output descriptors can be used to perform additional training of the machine-learning model, as desired.

Figure 12:
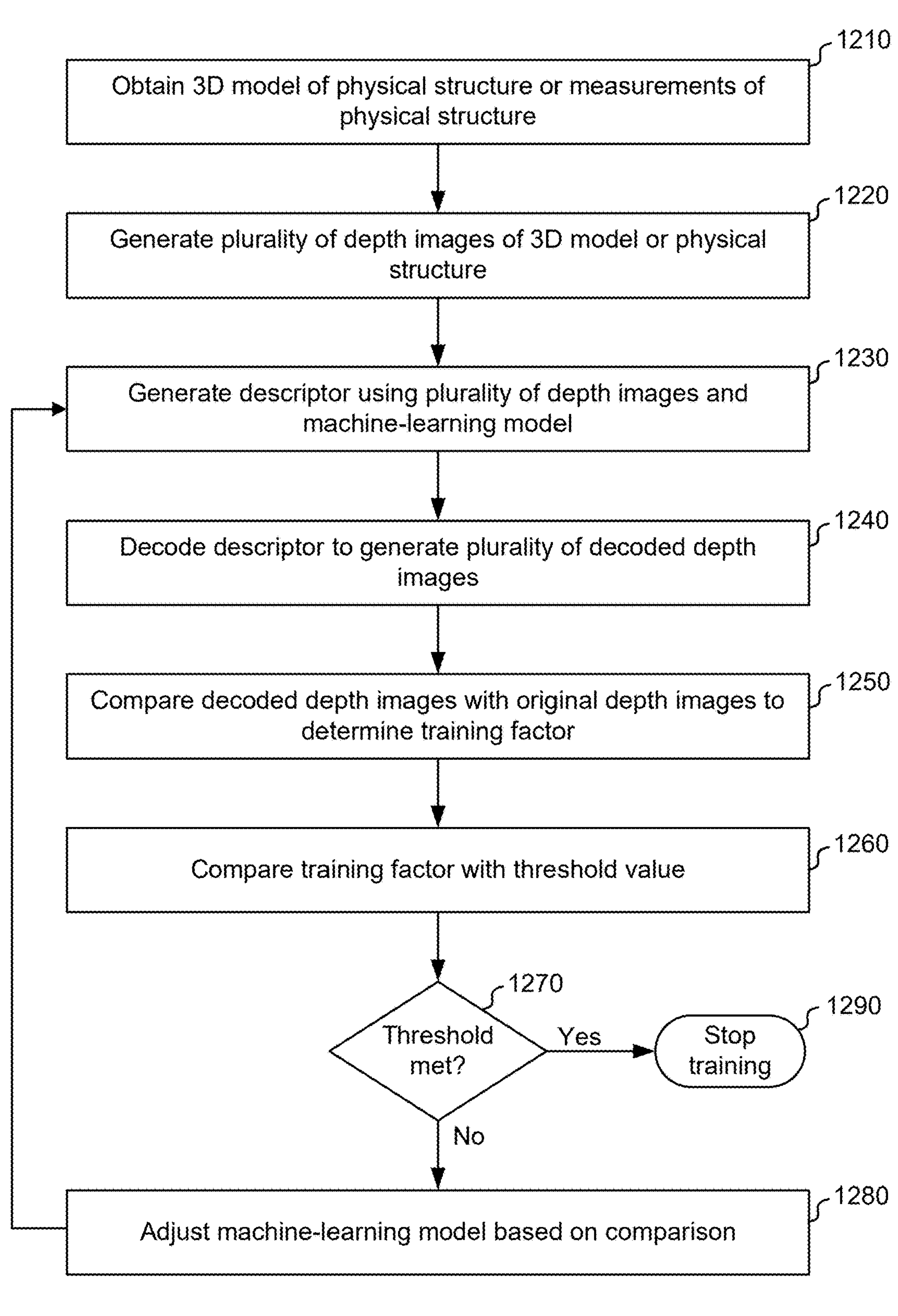
FIG. 12 is a flowchart illustrating a process for training a machine-learning model, according to certain aspects of the present disclosure.

FIG. 12 is a flowchart illustrating a process 1200 for training a machine-learning model for generating descriptors for 3D to allow for identification of 3D models that are similar to a new 3D model, according to certain aspects of the present disclosure. Process 1200 may be performed by any of the components illustrated in FIGS. 1-2, such as server 120. Process 1200 may be performed to train the machine-learning model to generate descriptors using depth images and may be used, for example, to train the machine-learning model in ways that enhance the descriptors generated to emphasize certain features common among all 3D models used for the training purposes.

Process 1200 begins at block 1210, where server 120 may obtain a 3D model. In some implementations, server 120 may receive, retrieve, or generate the new 3D model. At block 1220, server 120 may generate a plurality of depth images of the 3D model. The depth images and the 3D model may be stored in appropriate data stores, as desired, such as 3D model data store 210 and image data store 220, respectively. 3D model data store 210 may be populated with existing 3D models, image data store 220 may be populated with existing depth images, and descriptor data store may 230 be populated with existing descriptors.

At block 1230, server 120 may generate a descriptor for the 3D model using the plurality of depth images such as by using the plurality of depth images to a machine-learning model. The descriptor so generated may be used, at block 1240, in a decoding process, where the descriptor is used to generate a plurality of decoded depth images.

At block 1250, the decoded depth images may be compared against the original depth images to identify differences in the depth images. Various processes can be used for the comparison purposes, but one example includes a pixel-by-pixel difference determination, and a determination of an average pixel difference variation can be used to identify a training factor, such as a measure of how close the decoded depth images are to the original depth images. In some examples, the training factor may represent a quality of the fit between the original depth images and consist of a single value, such as between 0 and 1 (where 0 represents a completely imperfect match and 1 represents a completely perfect match). In other examples, the training factor can be a multi-component variable, such as including aspects relating to the encoding of the depth images at different spatial scales.

The training factor can be compared with a threshold value at block 1260. If the threshold is not met, at block 1270, the machine-learning model can be adjusted, such as based on the comparison or the training factor and the process of generating a new descriptor started again at block 1230. If the threshold is met, at block 1270, training of the machine-learning model can be stopped, as indicated at block 1290.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art.

What is claimed is:

1. A computer-implemented method comprising:

generating or obtaining a plurality of depth images of a physical structure or of a three-dimensional (3D) model of the physical structure from different viewpoints, wherein each depth image corresponds to a two-dimensional (2D) projection of the physical structure or the 3D model from a corresponding viewpoint of the different viewpoints and includes pixel information representing distances to the surfaces of the physical structure or 3D model that are visible from the corresponding viewpoint;

encoding, into a first encoded representation, the plurality of depth images at a first resolution generated according to a first spatial scale by a machine-learning model, wherein the first encoded representation encodes all of the information contained within the plurality of depth images at the first spatial scale;

encoding, into a second encoded representation, the plurality of depth images at a second resolution according to a second spatial scale by the machine-learning model, wherein the second encoded representation encodes all of the information contained within the plurality of depth images at the second spatial scale, wherein the first spatial scale and the second spatial scale are different; and concatenating the first encoded representation of the plurality of depth images at the first resolution and the second encoded representation of the plurality of depth images at the second resolution into a single descriptor characterizing the physical structure or the 3D model.

2. The computer-implemented method of claim 1, wherein the first encoded representation and the second encoded representation are concatenated into the single descriptor as separately identifiable elements of a multi-element vector data structure, the method further comprising:

generating, from a data structure, a plurality of existing descriptors that each comprise a corresponding multi-element vector data structure characterizing a corresponding existing 3D model formed by concatenating respective encoded representations of depth images encoded at different spatial scales by the machine-learning model; and querying the data structure of the plurality of existing descriptors to identify one or more output descriptors using the single descriptor as input, wherein the one or more output descriptors comprise existing descriptors from the plurality of existing descriptors that exhibit a similarity to the single descriptor that is greater than a threshold similarity value.

3. The computer-implemented method of claim 2, wherein the similarity characterizes a vector similarity or vector similarity magnitude between a first multi-element vector data structure corresponding to a first descriptor and a second multi-element vector data structure corresponding to a second descriptor.

4. The computer-implemented method of claim 2, wherein querying the data structure of the plurality of existing descriptors comprises performing a random forest search algorithm on the data structure to identify the one or more output descriptors.

5. The computer-implemented method of claim 2, wherein querying the data structure of the plurality of existing descriptors comprises using one or more decision trees to identify the one or more output descriptors.

6. The computer-implemented method of claim 2, further comprising querying the data structure of the plurality of existing descriptors to identify one or more additional similar output descriptors using the one or more output descriptors as input.

7. The computer-implemented method of claim 2, wherein the computer-implemented method further comprises:

comparing the multi-element vector data structure for the single descriptor and the corresponding multi-element vector data structures for the one or more output descriptors to quantify vector elements relevant to common characteristics in the physical structure or the 3D model and one or more corresponding existing 3D models associated with the one or more output descriptors.

8. The computer-implemented method of claim 2, further comprising obtaining one or more corresponding existing 3D models associated with the one or more output descriptors.

9. The computer-implemented method of claim 8, further comprising generating a display of the one or more corresponding existing 3D models and the physical structure or the 3D model.

10. The computer-implemented method of claim 8, further comprising updating the machine-learning model by:

generating or obtaining plurality of depth images for the one or more corresponding existing 3D models;

decoding the single descriptor and the one or more output descriptors to generate one or more decoded depth images;

comparing the one or more decoded depth images to corresponding depth images of the plurality of depth images to determine a training factor; and adjusting the machine-learning model based on the training factor.

11. The computer-implemented method of claim 1, wherein the plurality of depth images are primary orthogonal projections of the physical structure selected from the group consisting of a top view of the physical structure, a front view of the physical structure, a rear view of the physical structure, a left view of the physical structure, and a right view of the physical structure.

12. The computer-implemented method of claim 1, further comprising:

repeating, for a plurality of additional physical structures or additional 3D models:

generating one or more additional depth images for an additional physical structure or an additional 3D model;

generating, using the machine-learning model, an additional descriptor characterizing the additional physical structure or the additional 3D model using the one or more additional depth images; and storing the additional descriptor for the additional physical structure or the additional 3D model in a data structure.

13. The computer-implemented method of claim 1, wherein the machine-learning model uses a plurality of convolutional layers or a plurality of pooling layers.

14. The computer-implemented method of claim 1, wherein the machine-learning model is an autoencoder neural network.

15. The computer-implemented method of claim 1, further comprising:

training the machine-learning model by repeating one or more times:

decoding the single descriptor to generate one or more decoded depth images;

comparing the one or more decoded depth images to the plurality of depth images to determine a training factor;

adjusting the machine-learning model based on the training factor; and using the machine-learning model to update the single descriptor using the plurality of depth images; and stopping training the machine-learning model when the training factor meets a threshold training factor.

16. The computer-implemented method of claim 15, further comprising performing additional training of the machine-learning model by:

generating an additional plurality of depth images for an additional physical structure or an additional 3D model;

using the machine-learning model to generate an additional descriptor characterizing the additional physical structure or the additional 3D model using the additional plurality of depth images; and training the machine-learning model by repeating one or more times:

decoding the additional descriptor to generate an additional one or more decoded depth images;

comparing the additional one or more decoded depth images to the additional plurality of depth images to update the training factor;

adjusting the machine-learning model based on the training factor; and using the machine-learning model to update the additional descriptor using the additional plurality of depth images.

17. The computer-implemented method of claim 1, wherein the first resolution and the second resolution are lower than an initial resolution of the plurality of depth images.

18. The computer-implemented method of claim 1, wherein encoding the plurality of depth images comprises providing the plurality of depth images to the machine-learning model as a single input comprising the plurality of depth images, and generating the first encoded representation and the second encoded representation during a single invocation of the machine-learning model.

19. A system, comprising:

one or more processors; and a non-transitory computer-readable storage medium comprising instructions that, when executed on the one or more processors, cause the one or more processors to perform operations corresponding to the computer-implemented method of claim 1.

20. A computer-program product tangibly embodied in a non-transitory machine-readable storage medium, comprising instructions that, when executed by one or more processors, cause the one or more processors to perform operations comprising:

generating or obtaining one or more depth images of a physical structure or of a three-dimensional (3D) model of the physical structure, wherein a depth image corresponds to a two-dimensional (2D) projection of the physical structure or the 3D model from a corresponding viewpoint and includes pixel information representing distances of surfaces of the physical structure from the corresponding viewpoint;

encoding, into a first encoded representation of binary values, the one or more depth images at a first resolution generated according to a first spatial scale by a first convolutional layer of a machine-learning model, wherein the first convolutional layer encodes all of the information contained within the one or more depth images at the first spatial scale;

encoding, into a second encoded representation of binary values, the one or more depth images at a second resolution according to a second spatial scale by a second convolutional layer of the machine-learning model, wherein the second convolutional layer encodes all of the information contained within the one or more depth images at the second spatial scale, wherein the first spatial scale and the second spatial scale are different;

combining the first encoded representation from the output of the first convolutional layer with the second encoded representation from the output of the second convolutional layer into a single descriptor of binary values characterizing the physical structure or the 3D model;

generating, from a data structure, a plurality of existing descriptors each characterizing a corresponding existing 3D model; and querying the data structure of the plurality of existing descriptors to identify one or more output descriptors using the single descriptor as input, wherein the one or more output descriptors comprise existing descriptors from the plurality of existing descriptors that exhibit a similarity to the single descriptor that is greater than a threshold similarity value.

21. A computer-implemented method comprising:

generating or obtaining a plurality of depth images of a physical structure or of a three-dimensional (3D) model of the physical structure from different viewpoints, wherein each depth image corresponds to a two-dimensional (2D) projection of the physical structure or the 3D model from a corresponding viewpoint of the different viewpoints and includes pixel information representing distances to the surfaces of the physical structure or 3D model that are visible from the corresponding viewpoint;

encoding, into a first encoded representation, the plurality of depth images at a first resolution generated according to a first spatial scale by a machine-learning model, wherein the first encoded representation encodes all of the information contained within the plurality of depth images at the first spatial scale;

encoding, into a second encoded representation, the first encoded representation of the plurality of depth images at a second resolution according to a second spatial scale by the machine-learning model, wherein the second encoded representation encodes all of the information contained within the first encoded representation at the second spatial scale, wherein the first spatial scale and the second spatial scale are different; and concatenating the first encoded representation of the plurality of depth images at the first resolution and the second encoded representation of the plurality of depth images at the second resolution into a single descriptor characterizing the physical structure or the 3D model.

* * * * *